(12) United States Patent
Takata

(10) Patent No.: US 9,448,581 B2
(45) Date of Patent: Sep. 20, 2016

(54) TIMER UNIT CIRCUIT HAVING PLURALITY OF OUTPUT MODES AND METHOD OF USING THE SAME

(71) Applicant: Renesas Electronics Corporation, Kawasaki-shi (JP)

(72) Inventor: Yasuhiro Takata, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 1 day.

(21) Appl. No.: 14/560,960

(22) Filed: Dec. 4, 2014

(65) Prior Publication Data

US 2015/0089269 A1    Mar. 26, 2015

Related U.S. Application Data

(63) Continuation of application No. 13/343,437, filed on Jan. 4, 2012, now Pat. No. 8,909,973, which is a continuation of application No. 12/292,255, filed on Nov. 14, 2008, now Pat. No. 8,117,482.

(30) Foreign Application Priority Data

Nov. 21, 2007  (JP) ................. 2007-302302

(51) Int. Cl.
*G06F 1/04* (2006.01)
*G06F 1/06* (2006.01)
(Continued)

(52) U.S. Cl.
CPC ................. *G06F 1/06* (2013.01); *G06F 1/025* (2013.01); *G06F 1/04* (2013.01); *H03K 7/08* (2013.01)

(58) Field of Classification Search
CPC ............ G06F 1/025; G06F 1/04; G06F 1/06; H03K 7/08
USPC .................................................. 713/500, 600
See application file for complete search history.

(56) References Cited

U.S. PATENT DOCUMENTS 5,418,932 A   5/1995  Watabe et al.
5,729,720 A   3/1998  Kau et al.
(Continued)

FOREIGN PATENT DOCUMENTS

JP         5-115193 A    5/1993
JP         10-323084 A   12/1998

OTHER PUBLICATIONS

U.S. Notice of Allowance dated Aug. 4, 2014 in U.S. Appl. No. 13/343,437.
(Continued)

*Primary Examiner* — Chun Cao
(74) *Attorney, Agent, or Firm* — McGinn IP Law Group, PLLC

(57) ABSTRACT

A timer unit having a first output mode and a second output mode, the timer unit includes a first register that stores a first value, a second register that stores a second value, a third register that stores a third value, a counter that generates a count signal based on the first value, and an output circuit that outputs a first output signal and a second output signal. When the timer unit is set in the first output mode, the output circuit outputs the first output signal having a pulse width determined by the count signal and the second value, and outputs the second output signal having a pulse width determined by the count signal and the third value. When the timer unit is set in the second output mode, the output circuit outputs the first output signal having a pulse width determined by the count signal, the second value and the third value.

8 Claims, 22 Drawing Sheets

(51) Int. Cl.
*G06F 1/025* (2006.01)
*H03K 7/08* (2006.01)

(56) References Cited

U.S. PATENT DOCUMENTS

| | | |
|---|---|---|
| 5,825,141 A | 10/1998 | Matsui et al. |
| 5,832,255 A | 11/1998 | Roberts et al. |
| 5,842,005 A | 11/1998 | Walsh et al. |
| 6,658,583 B1 | 12/2003 | Kudo et al. |
| 7,017,069 B2 | 3/2006 | Kudo et al. |
| 8,117,482 B2 | 2/2012 | Takata |
| 8,909,973 B2 * | 12/2014 | Takata .................... G06F 1/025 713/500 |

OTHER PUBLICATIONS

U.S. Office Action dated Apr. 10, 2014 in U.S. Appl. No. 13/343,437.
U.S. Office Action dated Aug. 29, 2014 in U.S. Appl. No. 13/343,437.

\* cited by examiner

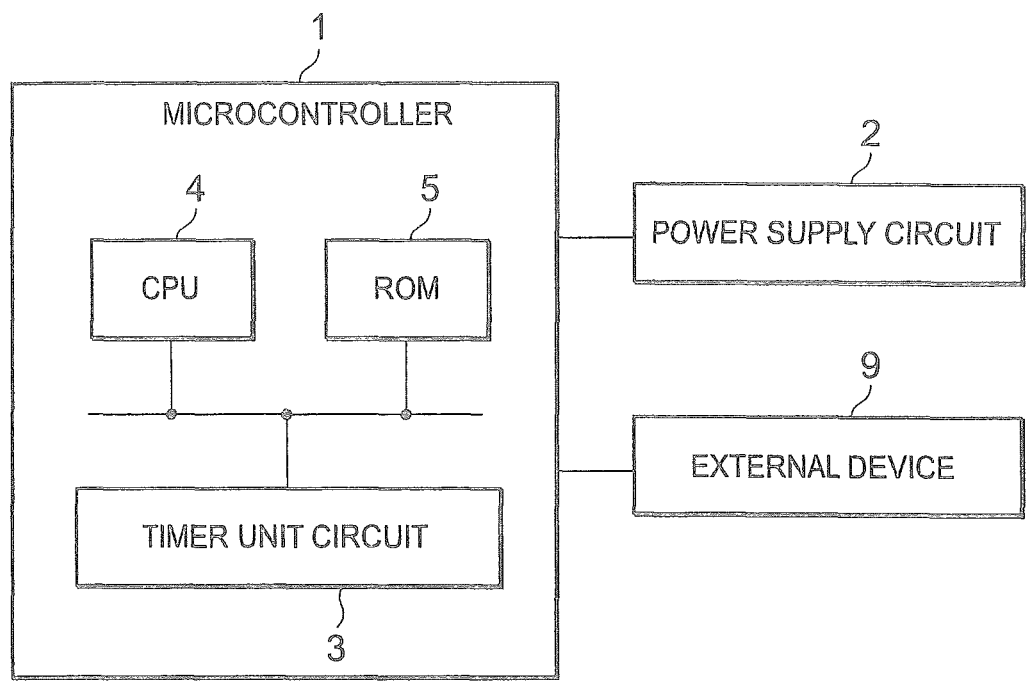

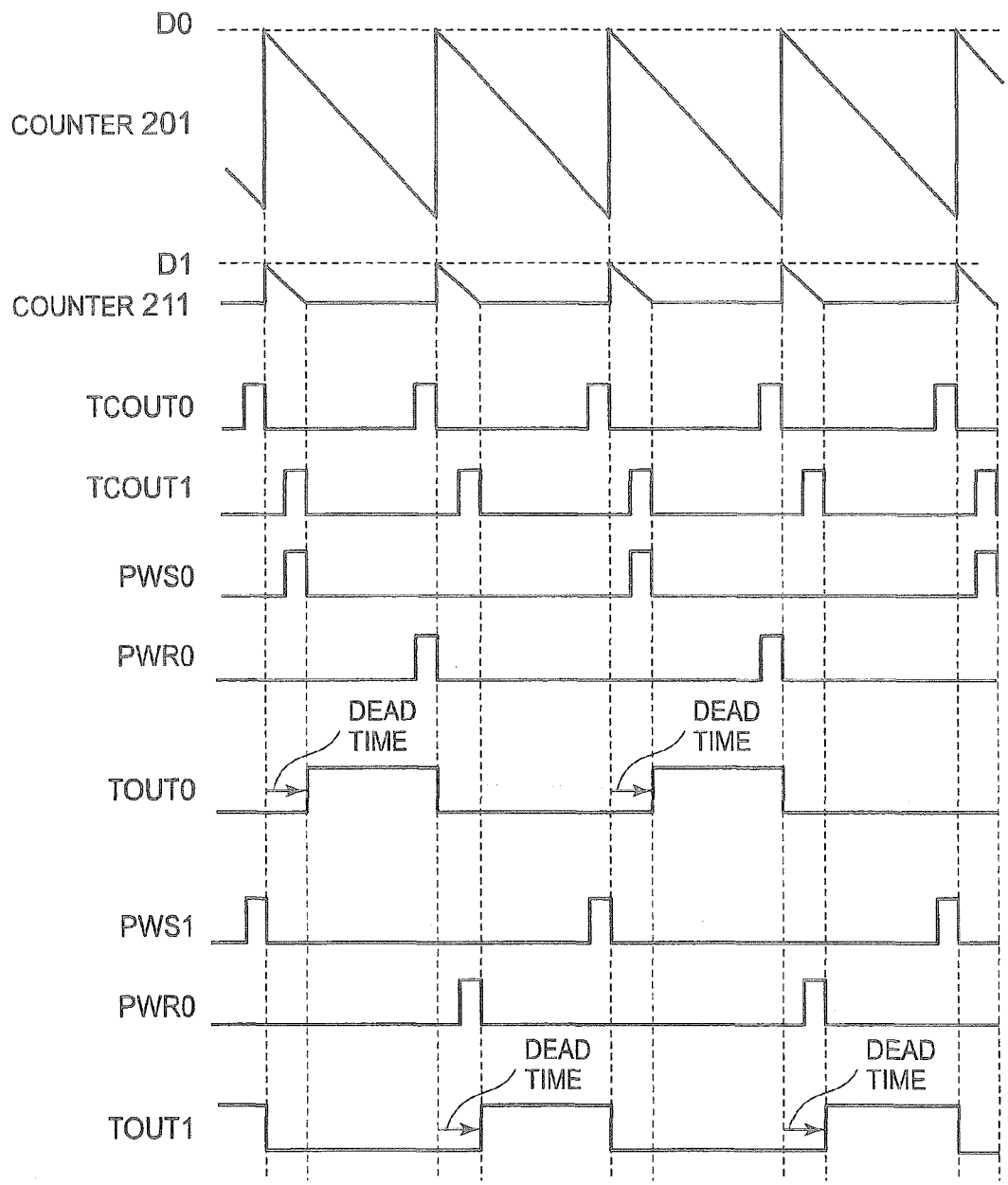

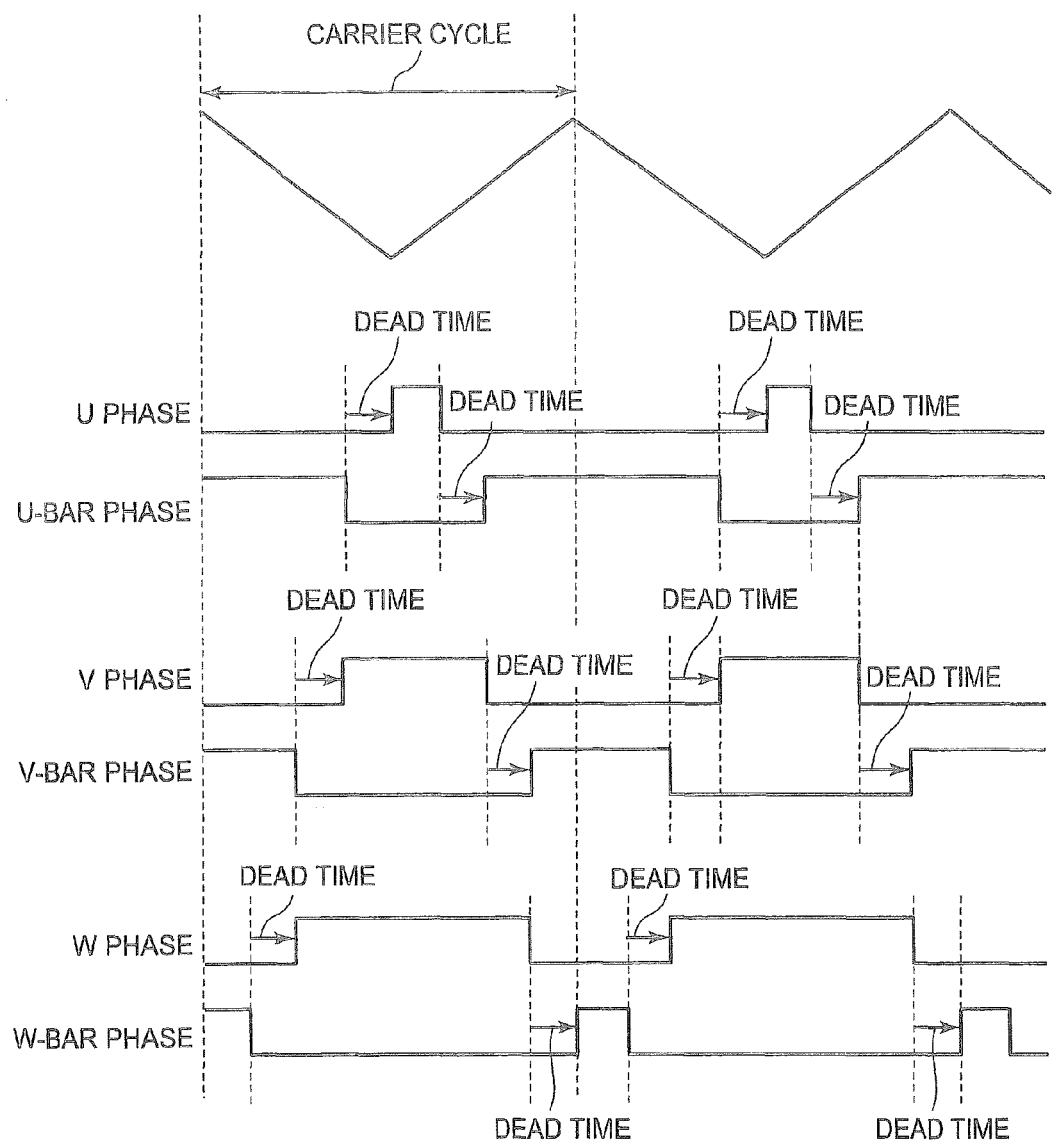

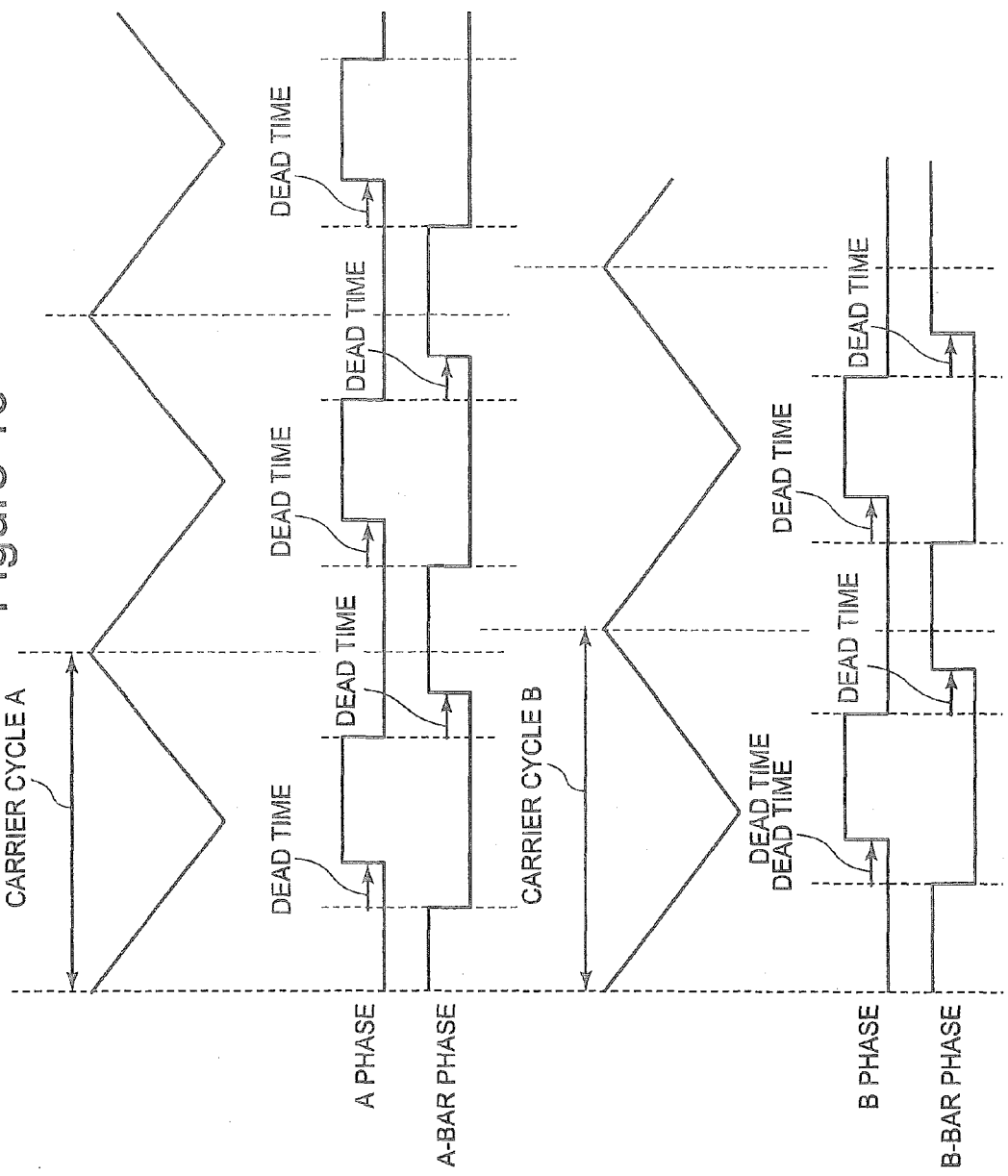

TIMER UNIT CIRCUIT HAVING PLURALITY OF OUTPUT MODES AND METHOD OF USING THE SAME

The present application is a Continuation Application of U.S. patent application Ser. No. 13/343,437, filed on Jan. 4, 2012, which is a Continuation Application of U.S. patent application Ser. No. 12/292,255, filed on Nov. 14, 2008, now U.S. Pat. No. 8,117,482, which is based on and claims priority from Japanese patent application No. 2007-302302, filed on Nov. 21, 2007, the entire contents of which are incorporated herein by reference.

BACKGROUND OF THE INVENTION

1. Field of the Invention

The present invention relates to a microcontroller, and specifically relates to a timer unit circuit included in a microcontroller.

2. Description of Related Art

Microcontrollers have been employed in various types of products. These microcontrollers have provided various types of control by executing control based on a program stored in a ROM (Read Only Memory), while they have been designed to have a common configuration to the greatest possible extent to reduce the costs.

However, for a timer unit circuit included in a microcontroller, a dedicated product has been designed in response to demanded control, for example, control of an inverter for a motor. Accordingly, it has been difficult to reduce the development costs of the microcontrollers.

FIG. 1 shows a microcontroller for motor control, which is disclosed in Japanese Patent Application Laid-open No. 5-115193 (Patent Document1). The microcontroller includes a timer B, one-shot pulse timers A0 to A2, timers C0 to C2, toggle flip-flops TFF0 to TFF2, D-flip-flops DFF01 to DFF22, NAND circuits NAND01 to NAND22, output stop registers STR0 to STR2, OR circuits OR, OR01 to OR22, output polarity setting buffers BF0 to BF2, AND circuits AND01 to AND22, and a flip-flop FF. An interrupt signal INTO and a reset signal RE are input to the OR circuit OR.

The microcontroller outputs a U-phase, a U-bar phase signal, a V-phase signal, a V-bar phase signal, a W-phase signal and a W-bar phase signal to control a three-phase motor. The timer B generates a signal corresponding to a PWM (Pulse Width Modulation) carrier frequency. The one-shot pulse timers A0 to A2 determine the pulse widths of the three phases. The timers C0 to C2 determine upper and lower-arm short circuit prevention times (dead times) for the three phases. In this microcontroller, the roles of the respective timers are fixed.

As a result of setting the output stop registers STR0 to STR2, the microcontroller can execute control of a two-phase operation mode.

Japanese Patent Application Laid-Open No. 10-323084 (Patent Document 2) discloses a motor control device used for control of a three-phase inverter motor.

SUMMARY

A timer unit circuit includes a first selection circuit and a first channel. The first channel includes a first counter circuit, a second counter circuit and a first output circuit. The first counter circuit includes a first counter that executes a counting operation synchronized with a first clock signal, based on a first trigger signal, and a first data register that retains a count start value when the first counter executes the counting operation. The second counter circuit includes a second counter that executes a counting operation synchronized with a second clock signal, based on a second trigger signal, and a second data register that retains a count start value when the second counter executes the counting operation. The first selection circuit selects a first signal as the first trigger signal, selects a second signal as the first clock signal, selects a third signal as the second trigger signal, and selects a fourth signal as the second clock signal. The first output circuit takes a first output mode and a second output mode. In the first output mode, the first output circuit outputs a first-output-mode first output signal exhibiting a normal-phase PWM waveform and a first-output-mode second output signal exhibiting a reversed-phase PWM waveform based on both of a first counter circuit output signal that the first counter circuit outputs based on a counter value of the first counter and a second counter circuit output signal that the second counter circuit outputs based on a counter value of the second counter. In the second output mode, the first output circuit outputs a second-output-mode first output signal that is based on either one of the first counter circuit output signal and the second counter circuit output signal and is not based on the other.

A method for using a timer unit circuit includes the steps of: selecting a first signal as a first trigger signal, selecting a second signal as a first clock signal, selecting a third signal as a second trigger signal, selecting a fourth signal as a second clock signal, and selecting one of a first output mode and a second output mode as an output mode for a first output circuit. A first counter executes a counting operation synchronized with the first clock signal, based on the first trigger signal. A first data register retains an initial count value when the first counter executes the counting operation. A second counter executes a counting operation synchronized with the second clock signal, based on the second trigger signal. A second data register retains an initial count value when the second counter executes the counting operation. In a first output mode, the first output circuit outputs a first-output-mode first output signal exhibiting a normal-phase PWM waveform and a first-output-mode second output signal exhibiting a reversed-phase PWM waveform based on both of a first counter circuit output signal that the first counter circuit outputs based on a counter value of the first counter and a second counter circuit output signal that the second counter circuit outputs based on a counter value of the second counter. In a second output mode, the first output circuit outputs a second-output-mode first output signal that is based on either one of the first counter circuit output signal and the second counter circuit output signal and is not based on the other.

According to the aspect of the present invention, a highly-versatile timer unit circuit and a method for using the same are provided.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 2 is a block diagram of a microcontroller according to a first exemplary embodiment of the present invention;

FIG. 4 is a waveform diagram illustrating a two-phase PWM waveform output mode;

FIG. 7 is a waveform diagram illustrating an overview of operation example 1;

FIG. 10 is a waveform diagram according to operation example 2;

DETAILED DESCRIPTION OF THE EXEMPLARY EMBODIMENTS

First Exemplary Embodiment

FIG. 2 shows a microcontroller 1 according to a first exemplary embodiment of the present invention. The microcontroller 1 includes a timer unit circuit 3, a CPU (Central Processing Unit) 4 and a ROM 5. The ROM 5 stores a control program. The control program is loaded to a RAM (Random Access Memory) that is not shown, and the CPU 4 executes the control program. The microcontroller 1 controls a power supply circuit 2 or outputs signals for an external device 9. The power supply circuit 2 supplies power to a motor or a heating coil for induction heating.

Figure 1:
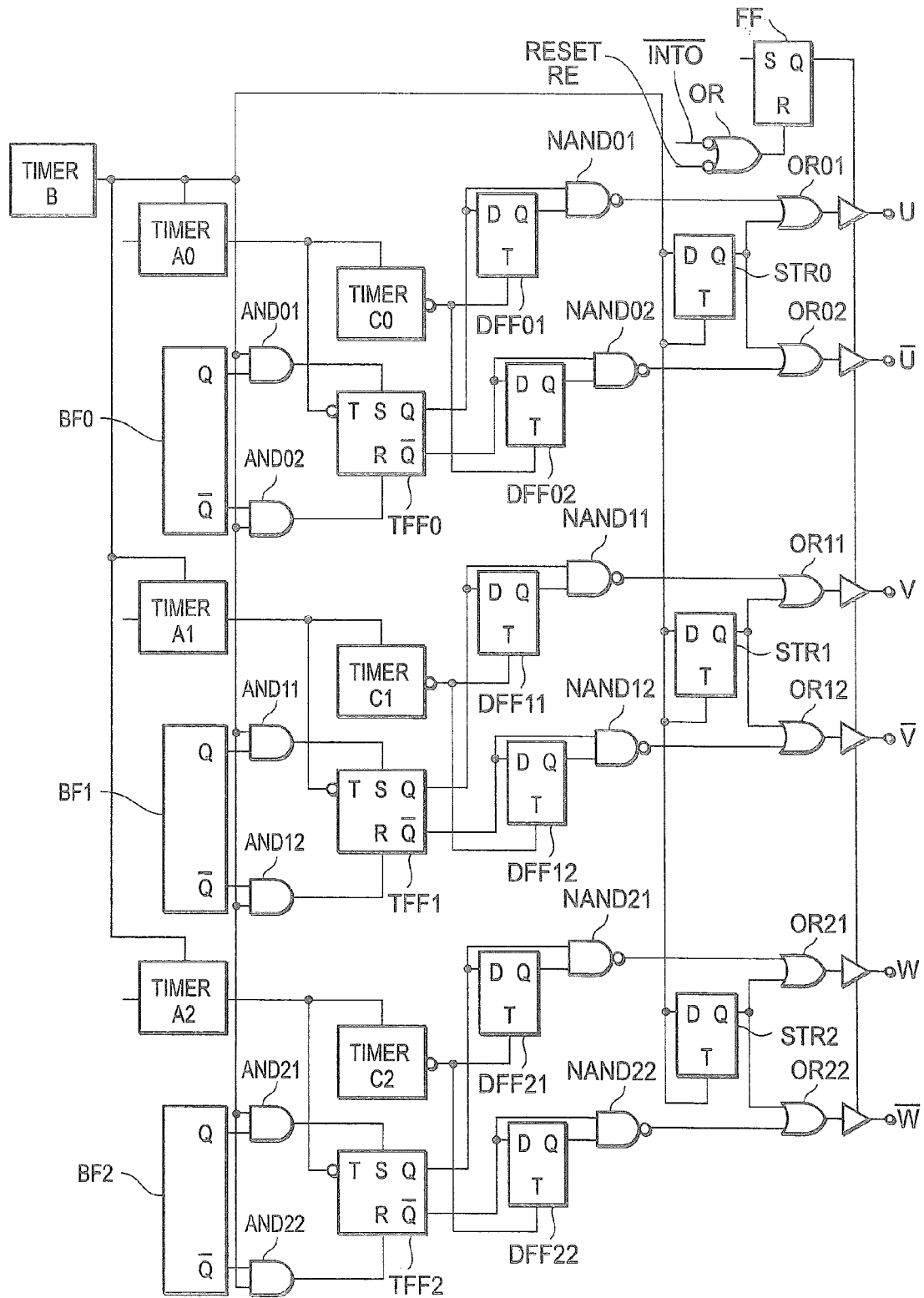
FIG. 1 is a block diagram of a microcontroller for motor control of a related art.
Figure 3A:
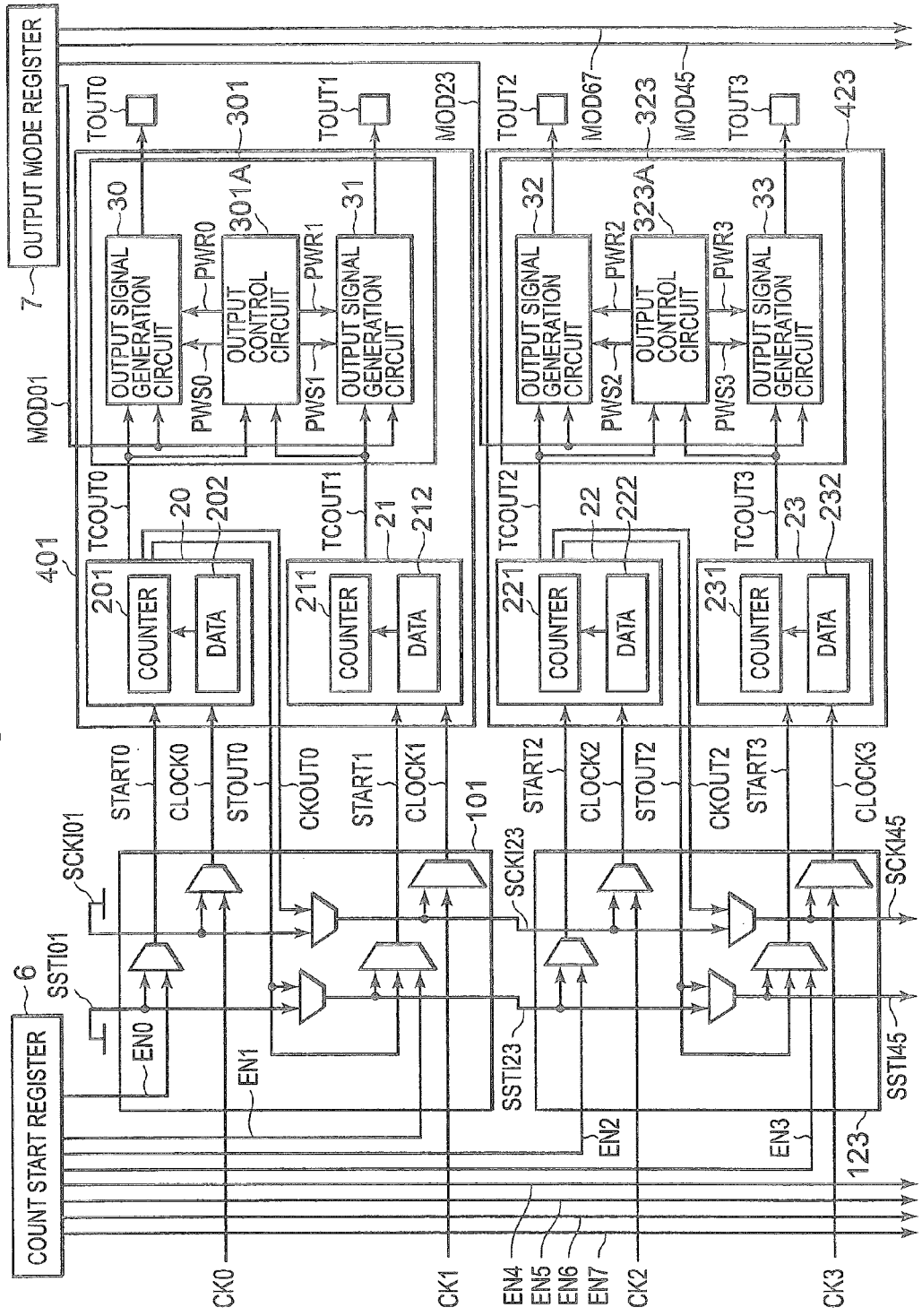
FIGS. 3A and 3B are block diagrams of a timer unit circuit according to the first exemplary embodiment.

As shown in FIG. 3A, the timer unit circuit 3 includes a count start register 6, an output mode register 7, selection circuits 101 and 123, and channels 401 and 423. The channel 401 includes counter circuits 20 and 21, and an output circuit 301. The counter circuit 20 includes a counter 201 and a data register 202 that retains a count start value D0 of the counter 201. The counter circuit 21 includes a counter 211 and a data register 212 that retains a count start value D1 of the counter 211. The output circuit 301 includes output signal generation circuits 30 and 31, and an output control circuit 301A. The channel 423 includes counter circuits 22 and 23, and an output circuit 323. The counter circuit 22 includes a counter 221 and a data register 222 that retains a count start value D2 of the counter 221. The counter circuit 23 includes a counter 231 and a data register 232 that retains a count start value D3 of the counter 231. The output circuit 323 includes output signal generation circuits 32 and 33, and an output control circuit 323A.

Figure 3B:
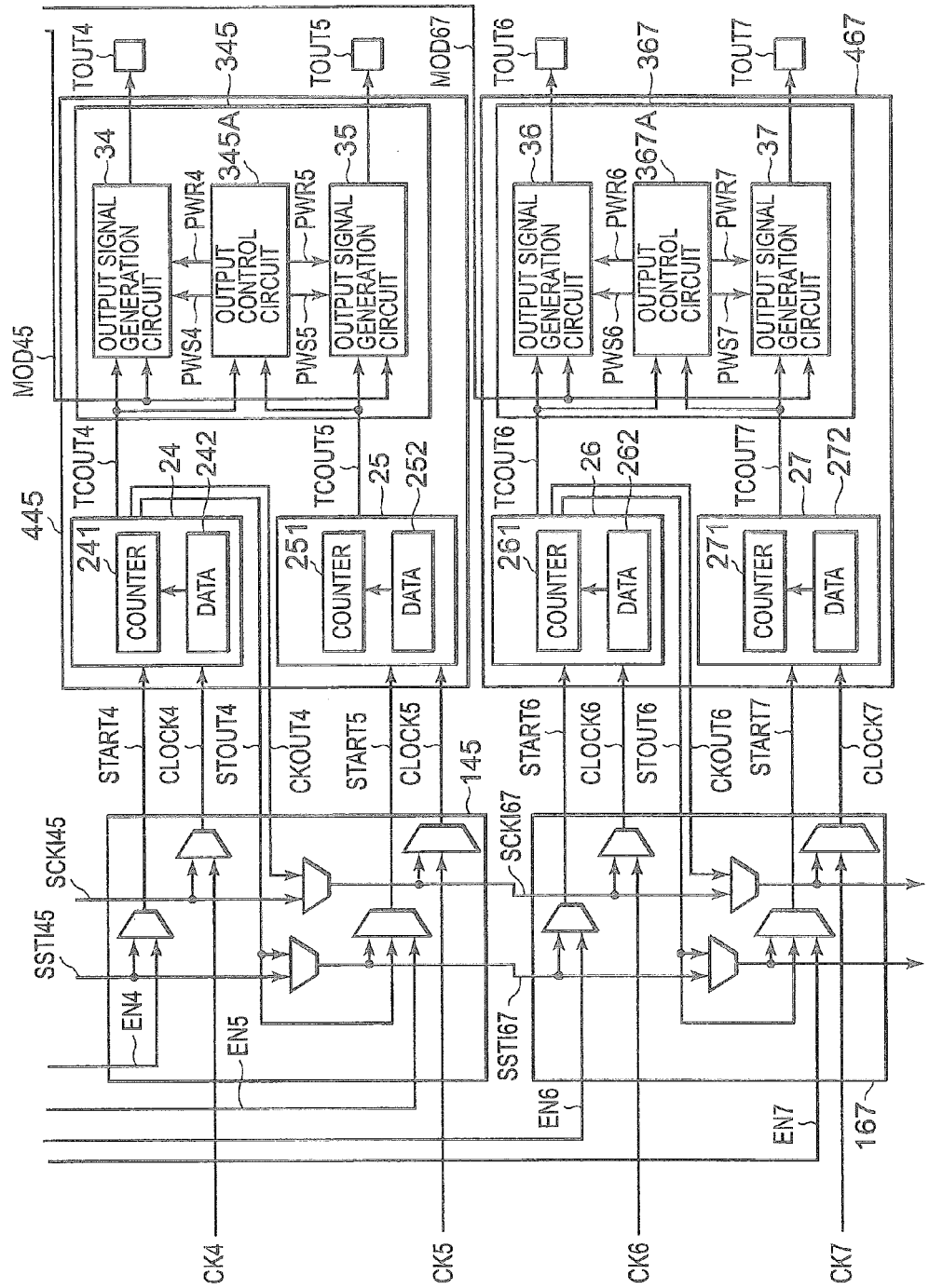

As shown in FIG. 3B, the timer unit circuit 3 includes selection circuits 145 and 167, and channels 445 and 467. The channel 445 includes counter circuits 24 and 25, and an output circuit 345. The counter circuit 24 includes a counter 241 and a data register 242 that retains a count start value D4 of the counter 241. The counter circuit 25 includes a counter 251 and a data register 252 that retains a count start value D5 of the counter 251. The output circuit 345 includes output signal generation circuits 34 and 35, and an output control circuit 345A. The channel 467 includes counter circuits 26 and 27, and an output circuit 367. The counter circuit 26 includes a counter 261 and a data register 262 that retains a count start value D6 of the counter 261. The counter circuit 27 includes a counter 271 and a data register 272 that retains a count start value D7 of the counter 271. The output circuit 367 includes output signal generation circuits 36 and 37, and an output control circuit 367A.

The count start register 6 outputs count enable signals EN0 and EN1 to the selection circuit 101, outputs count enable signals EN2 and EN3 to the selection circuit 123, outputs count enable signals EN4 and EN5 to the selection circuit 145, and outputs count enable signals EN6 and EN7 to the selection circuit 167.

The output mode register 7 outputs an output mode selection signal MOD01 to the output circuit 301, outputs an output mode selection signal MOD23 to the output circuit 323, outputs an output mode selection signal MOD45 to the output circuit 345, and outputs an output mode selection signal MOD67 to the output circuit 367.

Referring to FIG. 3A, the selection circuit 101 selects one from a count cycle transmission signal SSTI01, which indicates a fixed value, and the count enable signal EN0 as a trigger signal START0, and outputs it to the counter circuit 20. The selection circuit 101 selects one from a count clock transmission signal SCKI01, which indicates a fixed value, and a signal CK0 as a clock signal CLOCK0, and outputs it to the counter circuit 20.

The counter circuit 20 is controlled by the trigger signal START0 and the clock signal CLOCK0. The counter 201 starts counting pulses of the clock signal CLOCK0 based on a pulse of the trigger signal START0. The counter circuit 20 outputs a counter circuit output signal TCOUT0 to the output circuit 301 based on the counter value of the counter 201. The counter circuit 20 outputs a count cycle signal STOUT0 and a count clock signal CKOUT0 to the selection circuit 101. The count cycle signal STOUT0 and the counter circuit output signal TCOUT0 include a pulse for agreement between the counter value of the counter 201 and a predetermined value. The count clock signal CKOUT0 exhibits a waveform that is the same as that of the clock signal CLOCK0. The counter circuit 20 may output the clock signal CLOCK0 as the count clock signal CKOUT0.

The selection circuit 101 selects one from the count cycle transmission signal SSTI01 and the count cycle signal STOUT0 as a count cycle transmission signal SSTI23, and outputs it to the selection circuit 123. The selection circuit 101 selects one from the count clock transmission signal SCKI01 and the count clock signal CKOUT0 as a count clock transmission signal SCKI23, and outputs it to the selection circuit 123.

The selection circuit 101 selects one from the count cycle transmission signal SSTI23, the count cycle signal STOUT0 and the count enable signal EN1 as a trigger signal START1, and outputs it to the counter circuit 21. The selection circuit 101 selects one from the count clock transmission signal SCKI23 and a signal CK1 as a clock signal CLOCK1, and outputs it to the counter circuit 21.

The counter circuit 21 is controlled by the trigger signal START1 and the clock signal CLOCK1. The counter 211 starts counting pulses of the clock signal CLOCK1 based on a pulse of the trigger signal START1. The counter circuit 21 outputs a counter circuit output signal TCOUT1 to the output circuit 301 based on the counter value of the counter 211. The counter circuit output signal TCOUT1 includes a pulse for agreement between the counter value of the counter 211 and a predetermined value.

The output control circuit 301A receives the counter circuit output signals TCOUT0 and TCOUT1, outputs a set signal PWS0 and a reset signal PWR0 to the output signal generation circuit 30, and outputs a set signal PWS1 and a reset signal PWR1 to the output signal generation circuit 31. The output signal generation circuit 30 receives the counter circuit output signal TCOUT0, the output mode selection signal MOD01, the set signal PWS0 and the reset signal PWR0, and outputs an output signal TOUT0. The output signal generation circuit 31 receives the counter circuit output signal TCOUT1, the output mode selection signal MOD01, the set signal PWS1 and the reset signal PWR1, and outputs an output signal TOUT1.

The selection circuit 123 selects one from the count cycle transmission signal SSTI23 and the count enable signal EN2 as a trigger signal START2, and outputs it to the counter circuit 22. The selection circuit 123 selects one from the count clock transmission signal SCKI23 and a signal CK2 as a clock signal CLOCK2, and outputs it to the counter circuit 22.

The counter circuit 22 is controlled by the trigger signal START2 and the clock signal CLOCK2. The counter 221 starts counting pulses of the clock signal CLOCK2 based on a pulse of the trigger signal START2. The counter circuit 22 outputs a counter circuit output signal TCOUT2 to the output circuit 323 based on the counter value of the counter 221. The counter circuit 22 outputs a count cycle signal STOUT2 and a count clock signal CKOUT2 to the selection circuit 123. The count cycle signal STOUT2 and the counter circuit output signal TCOUT2 include a pulse for agreement between the counter value of the counter 221 and a predetermined value. The count clock signal CKOUT2 exhibits a waveform that is the same as that of the clock signal CLOCK2. The counter circuit 22 may output the clock signal CLOCK2 as the count clock signal CKOUT2.

The selection circuit 123 selects one from the count cycle transmission signal SSTI23 and the count cycle signal STOUT2 as a count cycle transmission signal SSTI45, and outputs it to the selection circuit 145. The selection circuit 123 selects one from the count clock transmission signal SCKI23 and the count clock signal CKOUT2 as a count clock transmission signal SCKI45, and outputs it to the selection circuit 145.

The selection circuit 123 selects one from the count cycle transmission signal SSTI45, the count cycle signal STOUT2 and the count enable signal EN3 as a trigger signal START3, and outputs it to the counter circuit 23. The selection circuit 123 selects one from the count clock transmission signal SCKI45 and a signal CK3 as a clock signal CLOCK3, and outputs it to the counter circuit 23.

The counter circuit 23 is controlled by the trigger signal START3 and the clock signal CLOCK3. The counter 231 starts counting pulses of the clock signal CLOCK3 based on a pulse of the trigger signal START3. The counter circuit 23 outputs a counter circuit output signal TCOUT3 to the output circuit 323 based on the counter value of the counter 231. The counter circuit output signal TCOUT3 includes a pulse for agreement between the counter value of the counter 231 and a predetermined value.

The output control circuit 323A receives the counter circuit output signals TCOUT2 and TCOUT3, outputs a set signal PWS2 and a reset signal PWR2 to the output signal generation circuit 32, and outputs a set signal PWS3 and a reset signal PWR3 to the output signal generation circuit 33. The output signal generation circuit 32 receives the counter circuit output signal TCOUT2, the output mode selection signal MOD23, the set signal PWS2 and the reset signal PWR2, and outputs an output signal TOUT2. The output signal generation circuit 33 receives the counter circuit output signal TCOUT3, the output mode selection signal MOD23, the set signal PWS3 and the reset signal PWR3, and outputs an output signal TOUT3.

Referring to FIG. 3B, the selection circuit 145 selects one from the count cycle transmission signal SSTI45 and the count enable signal EN4 as a trigger signal START4, and outputs it to the counter circuit 24. The selection circuit 145 selects one from the count clock transmission signal SCKI45 and a signal CK4 as a clock signal CLOCK4, and outputs it to the counter circuit 24.

The counter circuit 24 is controlled by the trigger signal START4 and the clock signal CLOCK4. The counter 241 starts counting pulses of the clock signal CLOCK4 based on a pulse of the trigger signal START4. The counter circuit 24 outputs a counter circuit output signal TCOUT4 to the output circuit 345 based on the counter value of the counter 241. The counter circuit 24 outputs a count cycle signal STOUT4 and a count clock signal CKOUT4 to the selection circuit 145. The count cycle signal STOUT4 and the counter circuit output signal TCOUT4 include a pulse for agreement between the counter value of the counter 241 and a predetermined value. The count clock signal CKOUT4 exhibits a waveform that is the same as that of the clock signal CLOCK4. The counter circuit 24 may output the clock signal CLOCK4 as the count clock signal CKOUT4.

The selection circuit 145 selects one from the count cycle transmission signal SSTI45 and the count cycle signal STOUT4 as a count cycle transmission signal SSTI67, and outputs it to the selection circuit 167. The selection circuit 145 selects one from the count clock transmission signal SCKI45 and the count clock signal CKOUT4 as a count clock transmission signal SCKI67, and outputs it to the selection circuit 167.

The selection circuit 145 selects one from the count cycle transmission signal SSTI67, the count cycle signal STOUT4 and the count enable signal EN5 as a trigger signal START5, and outputs it to the counter circuit 25. The selection circuit 145 selects one from the count clock transmission signal SCKI67 and a signal CK5 as a clock signal CLOCK5, and outputs it to the counter circuit 25.

The counter circuit 25 is controlled by the trigger signal START5 and the clock signal CLOCK5. The counter 251 starts counting pulses of the clock signal CLOCK5 based on a pulse of the trigger signal START5. The counter circuit 25 outputs a counter circuit output signal TCOUT5 to the output circuit 345 based on the counter value of the counter 251. The counter circuit output signal TCOUT5 includes a pulse for agreement between the counter value of the counter 251 and a predetermined value.

The output control circuit 345A receives the counter circuit output signals TCOUT4 and TCOUT5, outputs a set signal PWS4 and a reset signal PWR4 to the output signal generation circuit 34, and outputs a set signal PWS5 and a reset signal PWR5 to the output signal generation circuit 35. The output signal generation circuit 34 receives the counter circuit output signal TCOUT4, the output mode selection signal MOD45, the set signal PWS4 and the reset signal PWR4, and outputs an output signal TOUT4. The output signal generation circuit 35 receives the counter circuit output signal TCOUT5, the output mode selection signal MOD45, the set signal PWS5 and the reset signal PWR5, and outputs an output signal TOUT5.

The selection circuit 167 selects one from the count cycle transmission signal SSTI67 and the count enable signal EN6 as a trigger signal START6, and outputs it to the counter circuit 26. The selection circuit 167 selects one from the count clock transmission signal SCKI67 and a signal CK6 as a clock signal CLOCK6, and outputs it to the counter circuit 26.

The counter circuit 26 is controlled by the trigger signal START6 and the clock signal CLOCK6. The counter 261 starts counting pulses of the clock signal CLOCK6 based on a pulse of the trigger signal START6. The counter circuit 26 outputs a counter circuit output signal TCOUT6 to the output circuit 367 based on the counter value of the counter 261. The counter circuit 26 outputs a count cycle signal STOUT6 and a count clock signal CKOUT6 to the selection circuit 167. The count cycle signal STOUT6 and the counter circuit output signal TCOUT6 include a pulse for agreement between the counter value of the counter 261 and a predetermined value. The count clock signal CKOUT6 exhibits a waveform that is the same as that of the clock signal CLOCK6. The counter circuit 26 may output the clock signal CLOCK6 as the count clock signal CKOUT6.

The selection circuit 167 selects one from the count cycle transmission signal SSTI67, the count cycle signal STOUT6 and the count enable signal EN7 as a trigger signal START7, and outputs it to the counter circuit 27. The selection circuit 167 selects one from the count clock transmission signal SCKI67, the count clock signal CKOUT6 and a signal CK7 as a clock signal CLOCK7, and outputs it to the counter circuit 27.

The counter circuit 27 is controlled by the trigger signal START7 and the clock signal CLOCK7. The counter 271 starts counting pulses of the clock signal CLOCK7 based on a pulse of the trigger signal START7. The counter circuit 27 outputs a counter circuit output signal TCOUT7 to the output circuit 367 based on the counter value of the counter 271. The counter circuit output signal TCOUT7 includes a pulse for agreement between the counter value of the counter 271 and a predetermined value.

The output control circuit 367A receives the counter circuit output signals TCOUT6 and TCOUT7, outputs a set signal PWS6 and a reset signal PWR6 to the output signal generation circuit 36, and outputs a set signal PWS7 and a reset signal PWR7 to the output signal generation circuit 37. The output signal generation circuit 36 receives the counter circuit output signal TCOUT6, the output mode selection signal MOD67, the set signal PWS6 and the reset signal PWR6, and outputs an output signal TOUT6. The output signal generation circuit 37 receives the counter circuit output signal TCOUT7, the output mode selection signal MOD67, the set signal PWS7 and the reset signal PWR7, and outputs an output signal TOUT7.

Hereinafter, the operation of the timer unit circuit 3 will be described using FIGS. 3A, 3B, 4 and 5.

By means of setting from the outside of the timer unit circuit 3, the count start register 6 outputs a one-shot pulse as each of the count enable signals EN0 to 7. Each of the selection circuits 101, 123, 145 and 167 selects, as a trigger signal to be output to a counter circuit, a count enable signal from the count start register 6 or a count cycle signal from another counter circuit. For example, the selection circuit 123 selects one from the count enable signal EN3, the count cycle signal STOUT0 and the count cycle signal STOUT2 as the trigger signal START3 to be output to the counter circuit 23. Each of the signals CK0 to 7 is supplied from the outside of the timer unit circuit 3 and they are independent from one another. Each of the selection circuits 101, 123, 145 and 167 selects, as a clock signal to be output to a counter, one of the signals CK0 to 7 or a count clock signal from another counter. For example, the selection circuit 123 selects one from the signal CK3, the count clock signal CKOUT0 and the count clock signal CKOUT2 as the clock signal CLOCK3 to be output to the counter circuit 23.

Referring to FIG. 4, after detection of an input of the trigger signal START0, the counter 201 starts down-counting from the count start value D0 in synchronization with the clock signal CLOCK0. In response to occurrence of an underflow in the counter value of the counter 201, the counter circuit 20 outputs a one-shot pulse as the counter circuit output signal TCOUT0, and outputs a one-shot pulse as the count cycle signal STOUT0.

Each of the counter circuits 22, 24, 26 operates as the counter circuit 20 does.

After detection of an input of the trigger signal START1, the counter 211 starts down-counting from the count start value D1 in synchronization with the clock signal CLOCK1. In response to occurrence of an underflow in the counter value of the counter 211, the counter circuit 21 outputs a one-shot pulse as the counter circuit output signal TCOUT1.

Each of the counter circuits 23, 25 and 27 operates as the counter circuit 21 does.

Each of the output circuits 301, 323, 345 and 367 selects an output mode based on a value set in the output mode register 7 from the outside of the timer unit circuit 3. The output modes for the output circuits 301, 323, 345 and 367 can be set independently from one another. When the output circuit 301 is set to a two-phase PWM waveform output mode, the output circuit 301 generates each of the output signals TOUT0 and TOUT1 based on both of the counter circuit output signals TCOUT0 and TCOUT1. In this case, one of the output signals TOUT0 and TOUT1 exhibits a normal-phase PWM waveform, and the other exhibits a reversed-phase PWM waveform. When the output circuit 301 is set to a single-phase waveform output mode, the output circuit 301 generates the output signal TOUT0 based only on one of the counter circuit output signals TCOUT0 and TCOUT1, and generates the output signal TOUT1 based only on the other. In this case, the output signal TOUT0 is not affected by the other, and the output signal TOUT1 is not affected by the one counter circuit output signal. The operations of the output circuits 323, 345 and 367 when they are set to a two-phase PWM waveform output mode is similar to the operation of the output circuit 301 set to a two-phase PWM waveform output mode. The operations of the output circuits 323, 345 and 367 when they are set to a single-phase waveform output mode is similar to the operation of the output circuit 301 set to a single-phase waveform output mode.

The operations of the output circuits 301, 323, 345 and 367 when the output mode register 7 is set to a two-phase PWM waveform output mode will be described using the output circuit 301 as an example.

The output mode register 7 outputs the output mode selection signal MOD01 exhibiting the two-phase PWM waveform output mode. In this case, the output signal generation circuits 30 and 31 are controlled by the output control circuit 301A. Based on the counter circuit output signals TCOUT0 and TCOUT1, the output control circuit 301A outputs the set signal PWS0 and the reset signal PWR0 as control signals for the output signal generation circuit 30, and outputs the set signal PWS1 and the reset signal PWR1 as control signals for the output signal generation circuit 31.

Referring to FIG. 4, the output control circuit 301A outputs pulses corresponding to the odd-number-th pulses of the counter circuit output signal TCOUT1 as the set signal PWS0, and outputs pulses corresponding to the even-number-th pulses of the counter circuit output signal TCOUT0 as the reset signal PWR0, outputs pulses corresponding to the odd-number-th pulses of the counter circuit output signal TCOUT0 as the set signal PWS1, and outputs pulses corresponding to the even-number-th pulses of the counter circuit output signal TCOUT1 as the reset signal PWR1.

The output signal generation circuit 30 outputs the output signal TOUT0 that is set to an ON level by means of pulses of the set signal PWS0, and is reset to an OFF level by means of pulses of the reset signal PWR0. Similarly, the output signal generation circuit 31 outputs the output signal TOUT1 that is set to an OFF level by means of pulses of the set signal PWS1 and is reset to an ON level by means of pulses of the reset signal PWR1. The output signals TOUT0 and TOUT1 exhibit a two-phase PWM waveform provided with fixed dead times. In the dead times, both of the output signals TOUT0 and TOUT1 are not at the ON level. The pulse widths of the output signals TOUT0 and TOUT1 are determined based on the counter circuit output signal TCOUT0. The dead time widths of the output signals TOUT0 and TOUT1 are determined based on the counter circuit output signal TCOUT1.

Next, the operations of the output circuits 301, 323, 345 and 367 when the output mode register 7 is set to a single-phase waveform output mode will be described using the output circuit 301 as an example.

The output mode register 7 outputs the output mode selection signal MOD01 exhibiting the single-phase waveform output mode. In this case, the output signal generation circuits 30 and 31 operate independently from each other. The output signal generation circuit 30 is directly controlled by the counter circuit output signal TCOUT0, and is not affected by the set signal PWS0 and the reset signal PWR0. The output signal generation circuit 31 is directly controlled by the counter circuit output signal TCOUT1, and is not affected by the set signal PWS1 and the reset signal PWR1.

Figure 5:
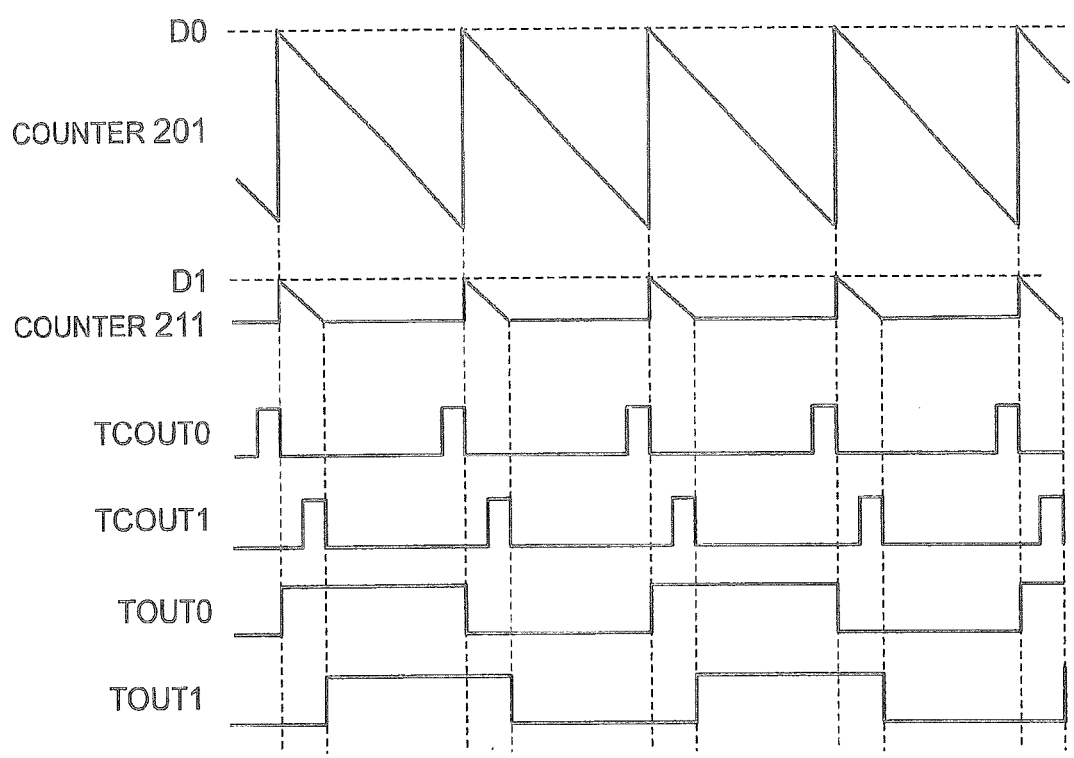
FIG. 5 is a waveform diagram illustrating a single-phase PWM waveform output mode.

Referring to FIG. 5, the output signal generation circuit 30 outputs pulses that are set to an ON level by means of the odd-number-th pulses of the counter circuit output signal TCOUT0, and are reset to an OFF level by means of the even-number-th pulses, as the output signal TOUT0. The output signal generation circuit 31 outputs pulses that are set to an ON level by means of the odd-number-th pulses of the counter circuit output signal TCOUT1 and are reset to an OFF level by means of the even-number-th pulses as the output signal TOUT1. The output signal TOUT0 is not affected by the counter circuit output signal TCOUT1, and the output signal TOUT1 is not affected by the counter circuit output signal TCOUT0. The output signals TOUT0 and TOUT1 exhibit single-phase waveforms that are independent from each other.

The operations of the output circuits 323, 345 and 367 are similar to the operation of the output circuit 301.

Operation Example 1

Operation example 1 of the timer unit circuit 3 for providing six-phase PWM control will be described below.

For six-phase PWM control, carrier cycle setting, duty setting and dead time setting are required. The carrier cycle setting is assigned to the counter circuit 20, the duty setting is assigned to each of the counter circuits 22, 24 and 26, and the dead time setting is assigned to each of the counter circuits 23, 25 and 27. The timer unit circuit 3 outputs the output signals TOUT2 to TOUT7 exhibiting six-phase PWM waveforms shown in FIG. 7. The six-phase PWM waveforms include a U-phase PWM waveform, a U-bar phase PWM waveform, a V-phase PWM waveform, a V-bar phase PWM waveform, a W-phase PWM waveform and a W-bar phase PWM waveform. Dead times are provided in the U-phase PWM waveform and the U-bar PWM waveform. Dead times are provided in the V-phase PWM waveform and the V-bar phase PWM waveform. Dead times are provided in the W-phase PWM waveform and the W-bar phase PWM waveform.

Hereinafter, operation example 1 will be described in details using FIGS. 6A, 6B and 8.

Figure 6A:
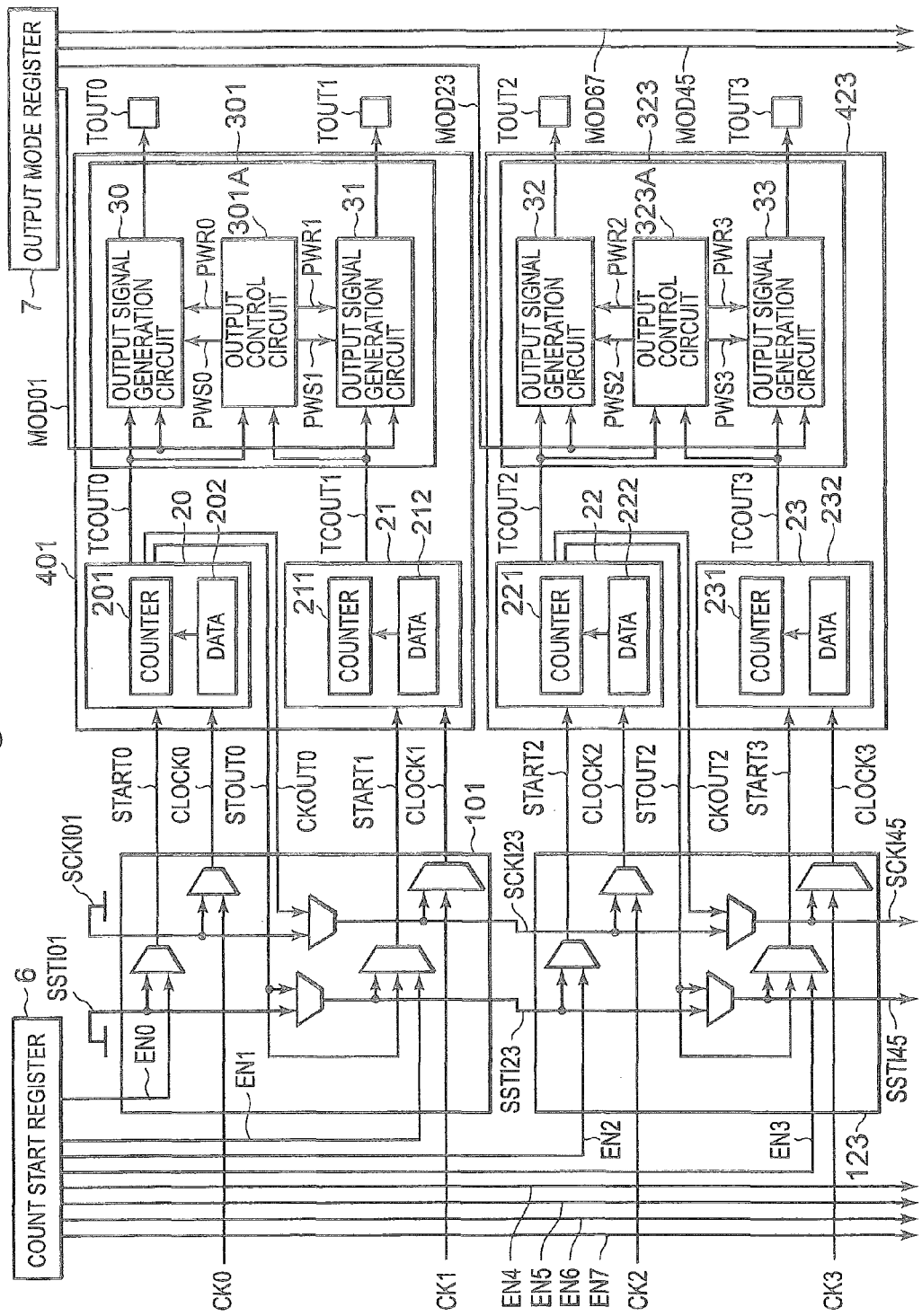
FIGS. 6A and 6B are block diagrams illustrating operation example 1 of a timer unit circuit.

Referring to FIG. 6A, the counter circuit 20 is used for the carrier cycle setting. The selection circuit 101 selects the count enable signal EN0 as the trigger signal START0, and selects the signal CK0 as the clock signal CLOCK0.

Figure 8:
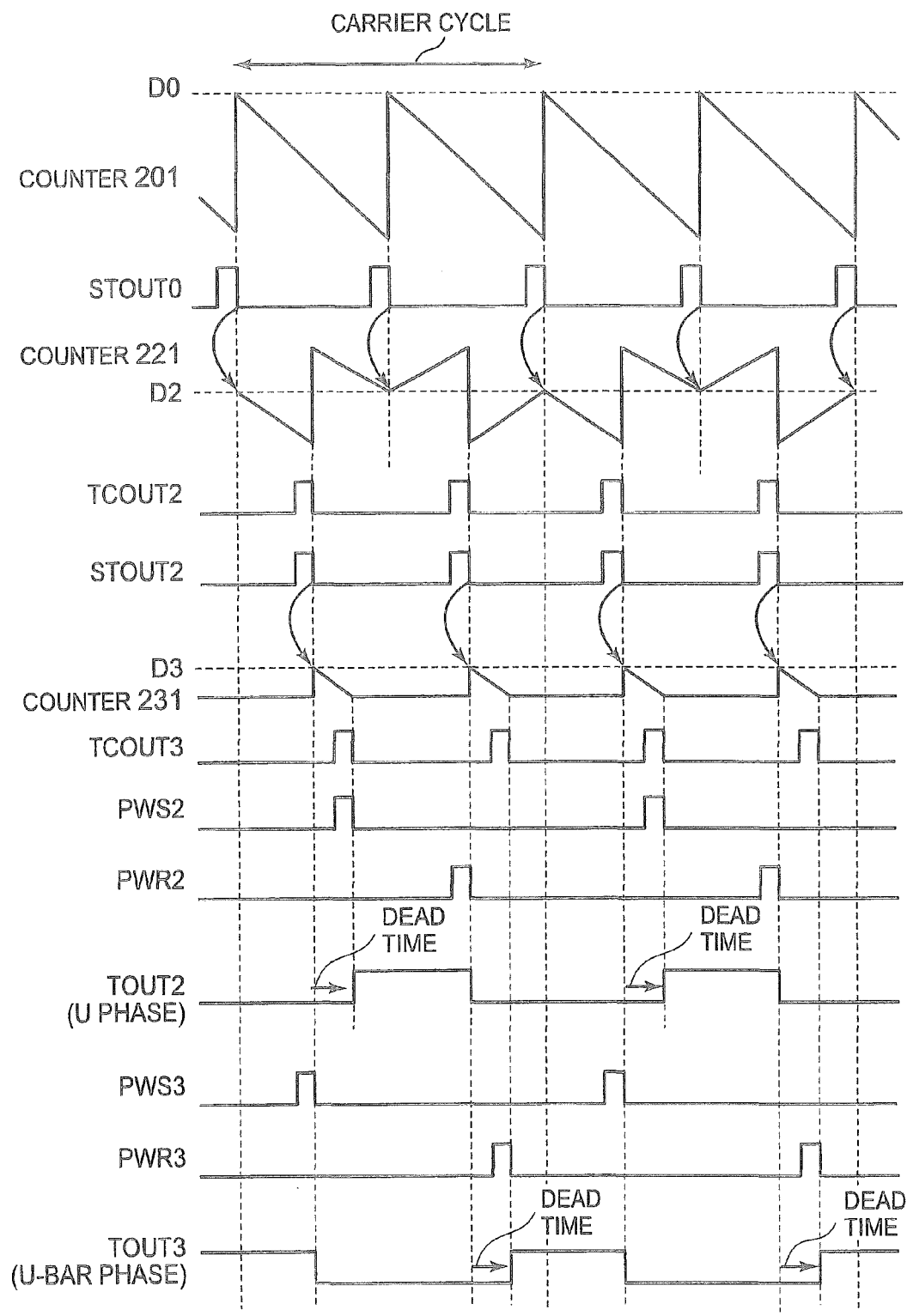
FIG. 8 is a waveform diagram illustrating the details of operation example 1.

Referring to FIG. 8, after detection of an input of the trigger signal START0, the counter 201 executes a down-counting operation from the count start value D0 in synchronization with the clock signal CLOCK0. The count start value D0 comes corresponding to a carrier cycle. After a lapse of time corresponding to the count start value D0, the counter circuit 20 outputs a one-shot pulse as the count cycle signal STOUT0.

Figure 6B:
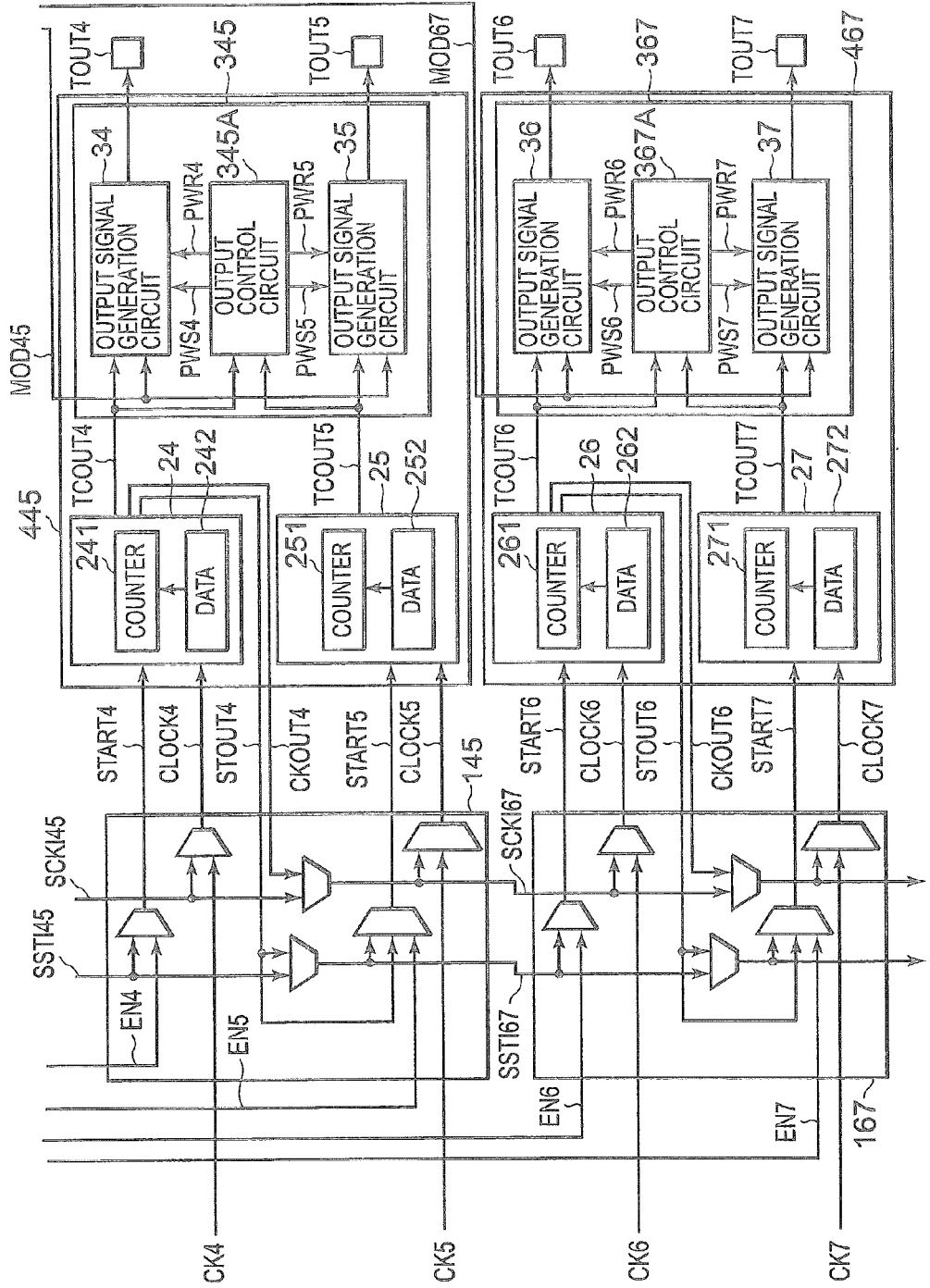

Referring to FIGS. 6A and 6B, the count cycle signal STOUT0 is transmitted via the selection circuits 101 and 123 to the counter circuit 22 as the trigger signal START2, is transmitted via the selection circuits 101, 123 and 145 to the counter circuit 24 as the trigger signal START4, and is transmitted via the selection circuits 101, 123, 145 and 167 to the counter circuit 26 as the trigger signal START6. Accordingly, the counter circuits 20, 22, 24 and 26 simultaneously start counting. The counter circuit 20 outputs the clock signal CLOCK0 as the count clock signal CKOUT0. The count clock signal CKOUT0 is transmitted via the selection circuits 101 and 123 to the counter circuit 22 as the clock signal CLOCK2, and is transmitted to the counter circuit 23 as the clock signal CLOCK3. The count clock signal CKOUT0 is transmitted via the selection circuits 101, 123 and 145 to the counter circuit 24 as the clock signal CLOCK4, and is transmitted to the counter circuit 25 as the clock signal CLOCK5. The count clock signal CKOUT0 is transmitted via the selection circuits 101, 123, 145 and 167 to the counter circuit 26 as the clock signal CLOCK6, and is transmitted to the counter circuit 27 as the clock signal CLOCK7. Accordingly, the clock signals are unified among the counter circuits 20, 22 to 27.

The selection circuit 101 selects the count cycle signal STOUT0 as the count cycle transmission signal SSTI23 and outputs it. The selection circuit 123 selects the count cycle transmission signal SSTI23 as the trigger signal START2. Accordingly, the counter circuit 22 is controlled by the count cycle signal STOUT0. The selection circuit 123 selects the count cycle transmission signal SSTI23 as the count cycle transmission signal SSTI45 and outputs it. The selection circuit 145 selects the count cycle transmission signal SSTI45 as the trigger signal START4. Accordingly, the counter circuit 24 is controlled by the count cycle signal STOUT0. The selection circuit 145 selects the count cycle transmission signal SSTI45 as the count cycle transmission signal SSTI67 and outputs it. The selection circuit 167 selects the count cycle transmission signal SSTI67 as the trigger signal START6. Accordingly, the counter circuit 26 is controlled by the count cycle signal STOUT0.

The selection circuit 101 selects the count clock signal CKOUT0 as the count clock transmission signal SCKI23 and outputs it. The selection circuit 123 selects the count clock transmission signal SCKI23 as the clock signals CLOCK2 and CLOCK3. Accordingly, the counter circuits 22 and 23 are controlled by the count clock signal CKOUT0. The selection circuit 123 selects the count clock transmission signal SCKI23 as the count clock transmission signal SCKI45 and outputs it. The selection circuit 145 selects the count clock transmission signal SCKI45 as the clock signals CLOCK4 and CLOCK5. Accordingly, the counter circuits 24 and 25 are controlled by the count clock signal CKOUT0. The selection circuit 145 selects the count clock transmission signal SCKI45 as the count clock transmission signal SCKI67 and outputs it. The selection circuit 167 selects the count clock transmission signal SCKI67 as the clock signals CLOCK6 and CLOCK7. Accordingly, the counter circuits 26 and 27 are controlled by the count clock signal CKOUT0.

Referring to FIG. 6A, the channel 423 generates the output signal TOUT2 exhibiting a U-phase PWM waveform, and the output signal TOUT3 exhibiting a U-bar phase PWM waveform. Referring to FIG. 6B, the channel 445 generates the output signal TOUT4 exhibiting a V-phase PWM waveform, and the output signal TOUT5 exhibiting a V-bar phase PWM waveform. The channel 467 generates the output signal TOUT6 exhibiting a W-phase PWM waveform, and the output signal TOUT7 exhibiting a W-bar phase PWM waveform.

The operation of the channel 423 will be described using FIG. 8. The counter circuit 22 is used for duty setting. In other words, the counter circuit 22 is used for setting the pulse widths of the PWM waveforms that the output signals TOUT2 and TOUT3 exhibit. The counter 221 starts a counting operation by means of the trigger signal START2 simultaneously with the counter 201. The counter 221 executes a down-counting operation from the count start value D2 in synchronization with the clock signal CLOCK2. Here, the count start value D2 comes corresponding to a duty width period. After a lapse of a duty width period, the counter circuit 22 outputs a one-shot pulse as each of the counter circuit output signal TCOUT2 and the count cycle signal STOUT2. Subsequently, the counter 221 is switched to perform an up-counting operation in response to an input of the next trigger signal START2, and after a lapse of the time consumed from the output of the one-shot pulse to the switching to the up-counting operation, outputs a one-shot pulse as each of the counter circuit output signal TCOUT2 and the count cycle signal STOUT2. The counter 221 is switched between a down-counting operation and an up-counting operation each time the trigger signal START2 is inputted. The count cycle signal STOUT2 is transmitted via the selection circuit 123 to the counter circuit 23 as the trigger signal START3 that controls the counter 231's start of counting.

The counter circuit 23 is used for the dead time setting. In other words, the counter circuit 23 is used for setting a dead time width period in which both of the PWM waveforms that the output signals TOUT2 and TOUT3 exhibit are not at an ON level. After detection of an input of the trigger signal START3, the counter 231 executes a down-counting operation from the count start value D3 in synchronization with the clock signal CLOCK3. The count start value D3 comes corresponding to a dead time width period. After a lapse of a dead time width period, the counter circuit 23 outputs a one-shot pulse as the counter circuit output signal TCOUT3.

The output circuit 323 receives the counter circuit output signals TCOUT2 and TCOUT3. The output mode register 7 outputs the output mode selection signal MOD23 exhibiting a two-phase PWM waveform output mode. The output mode selection signal MOD23 is a control signal for the output circuit 323. In the two-phase PWM waveform output mode, the output control circuit 323A is effective. The output control circuit 323A outputs the set signals PWS2 and PWS3, and the reset signals PWR2 and PWR3 based on the counter circuit output signals TCOUT2 and TCOUT3. The output control circuit 323A outputs pulses corresponding to the odd-number-th pulses of the counter circuit output signal TCOUT3 as the set signal PWS2, outputs pulses corresponding to the even-number-th pulses of the counter circuit output signal TCOUT2 as the reset signal PWR2, outputs pulses corresponding to the odd-number-th pulses of the counter circuit output signal TCOUT2 as the set signal PWS3, and outputs pulses corresponding to the even-number-th pulses of the counter circuit output signal TCOUT3 as the reset signal PWR3. The output signal TOUT2, which the output signal generation circuit 32 outputs, is set to an ON level by means of the pulses of the set signal PWS2, and is reset to an OFF level by means of the pulses of the reset signal PWR2. The output signal TOUT3, which the output signal generation circuit 33 outputs, is set to an OFF level by means of the pulses of the set signal PWS3, and is reset to an ON level by means of the pulses of the reset signal PWR3.

As a result of the above-described operation, the output signals TOUT2 and TOUT3 exhibit the U-phase PWM waveform and the U-bar phase PWM waveform shown in FIG. 7.

The channels 445 and 467 also operate as the channel 423 does. As a result, the channel 445 outputs the output signals TOUT4 and TOUT5 exhibiting the V-phase PWM waveform and the V-bar phase PWM waveform shown in FIG. 7. The channel 467 outputs the output signals TOUT6 and TOUT6 exhibiting the W-phase PWM waveform and the W-bar phase PWM waveform shown in FIG. 7.

The power supply circuit 2 supplies power to the motor based on the output signals TOUT2 to 7.

As described above, six-phase PWM control can be provided, enabling inverter control. The counter circuit 21 not used for six-phase PWM control can be used for a versatile function, which will be described later.

Operation Example 2

Operation example 2 of the timer unit circuit 3 for providing half-bridge control in different carrier cycles will be described below.

For half-bridge control, carrier cycle setting, duty setting and dead time setting are required. The carrier cycle setting is assigned to each of the counter circuits 20 and 24, the duty setting is assigned to each of the counter circuits 22 and 26, and the dead time setting is assigned to each of the counter circuits 23 and 27. The timer unit circuit 3 outputs the output signals TOUT2, TOUT3, TOUT6 and TOUT7 exhibiting half-bridge control waveforms shown in FIG. 10. The half-bridge control waveforms include an A-phase PWM waveform, an A-bar phase PWM waveform, a B-phase PWM waveform and a B-bar phase PWM waveform. The carrier cycle A of the A-phase PWM waveform and the A-bar phase PWM waveform is different from the carrier cycle B of the B-phase PWM waveform and the B-bar phase PWM waveform.

In operation example 2, the output signals TOUT2 and TOUT3 are generated using the channel 401 and the channel 423, and the output signals TOUT6 and TOUT7 are generated using the channel 445 and the channel 467. The output signals TOUT2 and TOUT3 exhibit the A-phase PWM waveform and the A-bar phase PWM waveform. The A-phase PWM waveform and the A-bar phase PWM waveform are provided with dead times. The output signals TOUT6 and TOUT7 exhibit the B-phase PWM waveform and the B-bar phase PWM waveform. The B-phase PWM waveform and the B-bar phase PWM waveform are provided with dead times.

Hereinafter, operation example 2 will be described in details using FIGS. 9A, 9B and 8.

Figure 9A:
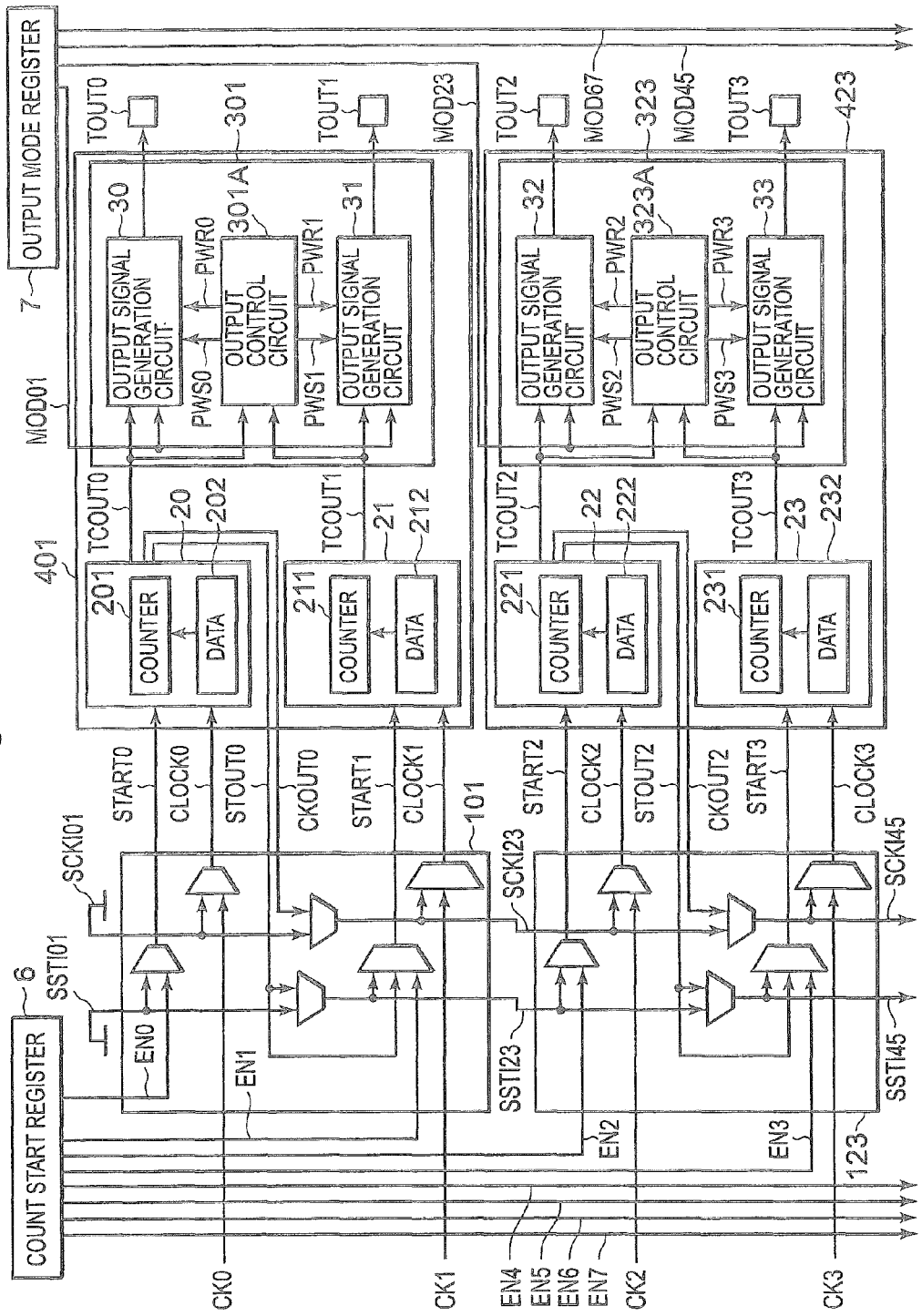
FIGS. 9A and 9B are block diagrams illustrating operation example 2 of a timer unit circuit.

Referring to FIG. 9A, the counter circuit 20 is used for setting the carrier cycle A. The selection circuit 101 selects the count enable signal EN0 as the trigger signal START0, and selects the signal CK0 as the clock signal CLOCK0.

Referring to FIG. 8, after detection of an input of the trigger signal START0, the counter 201 executes a down-counting operation from the count start value D0 in synchronization with the clock signal CLOCK0. The count start value D0 comes corresponding to the carrier cycle A. After a lapse of time corresponding to the count start value D0, the counter circuit 20 outputs a one-shot pulse as the count cycle signal STOUT0. Referring to FIG. 9A, the count cycle signal STOUT0 is transmitted via the selection circuits 101 and 123 to the counter circuit 22 as the trigger signal START1 Accordingly, the counter circuits 20 and 22 simultaneously start counting. The counter circuit 20 outputs the clock signal CLOCK0 as the count clock signal CKOUT0. The count clock signal CKOUT0 is transmitted via the selection circuits 101 and 123 to the counter circuit 22 as the clock signal CLOCK2, and is transmitted to the counter circuit 23 as the clock signal CLOCK3. Accordingly, the clock signals are unified among the counter circuits 20, 22 and 23.

The selection circuit 101 selects the count cycle signal STOUT0 as the count cycle transmission signal SSTI23 and outputs it. The selection circuit 123 selects the count cycle transmission signal SSTI23 as the trigger signal START2. Accordingly, the counter circuit 22 is controlled by the count cycle signal STOUT0.

The selection circuit 101 selects the count clock signal CKOUT0 as the count clock transmission signal SCKI23 and outputs it. The selection circuit 123 selects the count clock transmission signal SCKI23 as the clock signals CLOCK2 and CLOCK3. Accordingly, the counter circuits 22 and 23 are controlled by the count clock signal CKOUT0.

The counter circuit 22 is used for the duty setting. In other words, the counter circuit 22 is used for setting the pulse widths of the PWM waveforms that the output signals TOUT2 and TOUT3 exhibit. The counter 221 starts a counting operation by means of the trigger signal START2 simultaneously with the counter 201. The counter 221 executes a down-counting operation from the count start value D2 in synchronization with the clock signal CLOCK2. Here, the count start value D2 comes corresponding to a duty width period. After a lapse of a duty width period, the counter circuit 22 outputs a one-shot pulse as each of the counter circuit output signal TCOUT2 and the count cycle signal STOUT2. Subsequently, the counter 221 is switched to perform an up-counting operation in response to an input of the next trigger signal START2, and after a lapse of the time consumed from the output of the one-shot pulse to the switching to the up-counting operation, outputs a one-shot pulse as each of the counter circuit output signal TCOUT2 and the count cycle signal STOUT2. The counter 221 is switched between a down-counting operation and an up-counting operation each time the trigger signal START2 is inputted. The count cycle signal STOUT2 is transmitted via the selection circuit 123 to the counter circuit 23 as the trigger signal START3 that controls the counter 231's start of counting.

The counter circuit 23 is used for the dead time setting. In other words, the counter circuit 23 is used for setting a dead time width period in which both of the PWM waveforms the output signals TOUT2 and TOUT3 exhibit are not at an ON level. After detection of an input of the trigger signal START3, the counter 231 executes a down-counting operation from the count start value D3 in synchronization with the clock signal CLOCK5. The count start value D3 comes corresponding to a dead time width period. After a lapse of a dead time width period, the counter circuit 23 outputs a one-shot pulse as the counter circuit output signal TCOUT3.

The output circuit 323 receives the counter circuit output signals TCOUT2 and TCOUT3. The output mode register 7 outputs the output mode selection signal MOD23 exhibiting a two-phase PWM waveform output mode. The output mode selection signal MOD23 is a control signal for the output circuit 323. In the two-phase PWM waveform output mode, the output control circuit 323A is effective. The output control circuit 323A outputs the set signals PWS2 and PWS3, and the reset signals PWR2 and PWR3 based on the counter circuit output signals TCOUT2 and TCOUT3. The output control circuit 323A outputs pulses corresponding to the odd-number-th pulses of the counter circuit output signal TCOUT3 as the set signal PWS2, outputs pulses corresponding to the even-number-th pulses of the counter circuit output signal TCOUT2 as the reset signal PWR2, outputs pulses corresponding to the odd-number-th pulses of the counter circuit output signal TCOUT2 as the set signal PWS3, and outputs pulses corresponding to the even-number-th pulses of the counter circuit output signal TCOUT3 as the reset signal PWR3. The output signal TOUT2, which the output signal generation circuit 32 outputs, is set to an ON level by means of the pulses of the set signal PWS2, and is reset to an OFF level by means of the pulses of the reset signal PWR2. The output signal TOUT3, which the output signal generation circuit 33 outputs, is set to an OFF level by means of the pulses of the set signal PWS3, and is reset to an ON level by means of the pulses of the reset signal PWR3.

As a result of the above-described operation, the output signals TOUT2 and TOUT3 exhibit the U-phase PWM waveform and the U-bar phase PWM waveform shown in FIG. 8. The waveform that the output signals TOUT2 and TOUT3 exhibit correspond to the A-phase PWM waveform and the A-bar phase PWM waveform shown in FIG. 10.

Figure 9B:
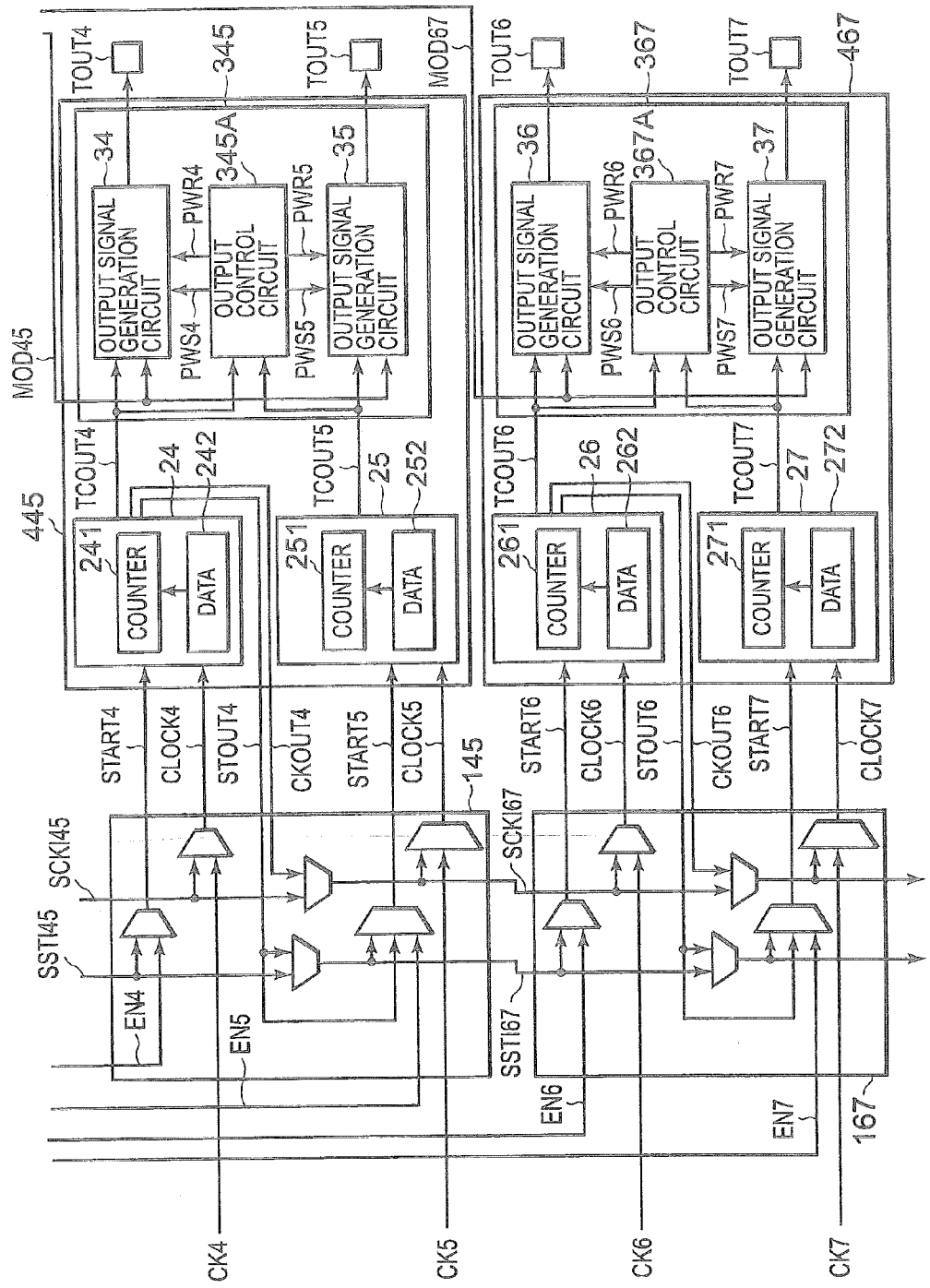

Referring to FIG. 9B, the counter circuit 24 is used for setting the carrier cycle B. The selection circuit 145 selects the count enable signal EN4 as the trigger signal START4, and selects the signal CK4 as the clock signal CLOCK4.

After detection of an input of the trigger signal START4, the counter 241 executes a down-counting operation from the count start value D4 in synchronization with the clock signal CLOCK4. The count start value D4 comes corresponding to the carrier cycle B. The operation of the counter 241 corresponds to the operation of the counter 201 shown in FIG. 8. Here, the count start value D4 corresponds to the count start value D0. After a lapse of time corresponding to the count start value D4, the counter circuit 24 outputs a one-shot pulse as the count cycle signal STOUT4. The waveform of the count cycle signal STOUT4 corresponds to the waveform of the count cycle signal STOUT0 shown in FIG. 8. The count cycle signal STOUT4 is transmitted via the selection circuits 145 and 167 to the counter circuit 26 as the trigger signal START6. Accordingly, the counter circuits 24 and 26 simultaneously start counting. The counter circuit 24 outputs the clock signal CLOCK4 as the count clock signal CKOUT4. The count clock signal CKOUT4 is transmitted via the selection circuits 145 and 167 to the counter circuit 26 as the clock signal CLOCK6, and is transmitted to the counter circuit 27 as the clock signal CLOCK7. Accordingly, the clock signals are unified among the counter circuits 24, 26 and 27.

The selection circuit 145 selects the count cycle signal STOUT4 as the count cycle transmission signal SSTI67 and outputs it. The selection circuit 167 selects the count cycle transmission signal SSTI67 as the trigger signal START6. Accordingly, the counter circuit 26 is controlled by the count cycle signal STOUT4.

The selection circuit 145 selects the count clock signal CKOUT4 as the count clock transmission signal SCKI67 and outputs it. The selection circuit 167 selects the count clock transmission signal SCKI67 as the clock signals CLOCK6 and CLOCK7. Accordingly, the counter circuit 26 and the counter circuit 27 are controlled by the count clock signal CKOUT4.

The counter circuit 26 is used for the duty setting. In other words, the counter circuit 26 is used for setting the pulse widths of the PWM waveforms that the output signals TOUT6 and TOUT7 exhibit. The counter 261 starts a counting operation by means of the trigger signal START6 simultaneously with the counter 241. The counter 261 executes a down-counting operation from the count start value D6 in synchronization with the clock signal CLOCK6. Here, the count start value D6 comes corresponding to a duty width period. After a lapse of a duty width period, the counter circuit 26 outputs a one-shot pulse as each of the counter circuit output signal TCOUT6 and the count cycle signal STOUT6. Subsequently, the counter 261 is switched to perform an up-counting operation in response to an input of the next trigger signal START6, and after a lapse of the time consumed from the output of the one-shot pulse to the switching to the up-counting operation, outputs a one-shot pulse as each of the counter circuit output signal TCOUT6 and the count cycle signal STOUT6. The counter 261 is switched between a down-counting operation and an up-counting operation each time the trigger signal START6 is inputted. The operation of the counter 261 corresponds to the operation of the counter 221 shown in FIG. 8. Here, the count start value D6 corresponds to the count start value D2. The waveforms of the counter circuit output signal TCOUT6 and the count cycle signal STOUT6 correspond to the waveforms of the counter circuit output signal TCOUT2 and the count cycle signal STOUT2 shown in FIG. 8, respectively. The count cycle signal STOUT6 is transmitted via the selection circuit 167 to the counter circuit 27 as the trigger signal START7 that controls the counter 271's start of counting.

The counter circuit 27 is used for the dead time setting. In other words, the counter circuit 27 is used for setting a dead time width period in which both of the PWM waveforms that the output signals TOUT6 and TOUT7 exhibit are not at an ON level. After detection of an input of the trigger signal START7, the counter 271 executes a down-counting operation from the count start value D7 in synchronization with the clock signal CLOCK7. The count start value D7 comes corresponding to a dead time width period. After a lapse of a dead time width period, the counter circuit 27 outputs a one-shot pulse as the counter circuit output signal TCOUT7. The operation of the counter 271 corresponds to the operation of the counter 231 shown in FIG. 8. Here, the count start value D7 corresponds to the count start value D3. The waveform of the counter circuit output signal TCOUT7 corresponds to the waveform of the counter circuit output signal TCOUT3 shown in FIG. 8.

The output circuit 367 receives the counter circuit output signals TCOUT6 and TCOUT7. The output mode register 7 outputs the output mode selection signal MOD67, which exhibits a two-phase PWM waveform output mode. The output mode selection signal MOD67 is a control signal for the output circuit 367. In the two-phase PWM waveform output mode, the output control circuit 367A is effective. The output control circuit 367A outputs the set signals PWS6 and PWS7, and the reset signals PWR6 and PWR7 based on the counter circuit output signals TCOUT6 and TCOUT7. The output control circuit 367A outputs pulses corresponding to the odd-number-th pulses of the counter circuit output signal TCOUT7 as the set signal PWS6, outputs pulses corresponding to the even-number-th pulses of the counter circuit output signal TCOUT6 as the reset signal PWR6, outputs pulses corresponding to the odd-number-th pulses of the counter circuit output signal TCOUT6 as the set signal PWS7, and outputs pulses corresponding to the even-number-th pulses of the counter circuit output signal TCOUT7 as the reset signal PWR7. The output signal TOUT6, which the output signal generation circuit 36 outputs, is set to an ON level by means of the pulses of the set signal PWS6, and is reset to an OFF level by means of the pulses of the reset signal PWR6. The output signal TOUT7, which the output signal generation circuit 37 outputs, is set to an OFF level by means of the pulses of the set signal PWS7, and is reset to an ON level by means of the pulses of the reset signal PWR7. The waveform of the set signal PWS6 corresponds to the waveform of the set signal PWS2 shown in FIG. 8. The waveform of the reset signal PWR6 corresponds to the waveform of the reset signal PWR2 shown in FIG. 8. The waveform of the set signal PWS7 corresponds to the waveform of the set signal PWS3 shown in FIG. 8. The waveform of the reset signal PWR7 corresponds to the waveform of the reset signal PWR3 shown in FIG. 8. The waveform of the output signal TOUT6 corresponds to the waveform of the output signal TOUT2 shown in FIG. 8. The waveform of the output signal TOUT7 corresponds to the waveform of the output signal TOUT3 shown in FIG. 8. The waveforms that the output signals TOUT6 and TOUT7 exhibit correspond to the B-phase PWM waveform and the B-bar phase PWM waveform shown in FIG. 10.

As described above, half-bridge control in different carrier cycles can be provided. The counter circuits 21 and 25, which are not used for half-bridge control in different carrier cycles, can be used for a versatile function, which will be described later.

In half-bridge control in different carrier cycles, the signals CK0 and CK4, which are clock signals different from each other, are used, and the count start register 6 outputs the count enable signals EN0 and EN4 at arbitrary timings. In the example shown in FIG. 10, the count start register 6 outputs the count enable signals EN0 and EN4 simultaneously, and the counter 201 and the counter 241 start a counting operation simultaneously.

Operation Example 3

Operation example 3 of the timer unit circuit 3 for providing full-bridge control will be described below.

Operation example 3 is different from operation example 2 on the following points. A common clock signal is used as the signal CK0 and the signal CK4. Furthermore, after a lapse of certain delay time from an output of the count enable signal EN0, the count start register 6 outputs the count enable signal EN4.

Figure 11:
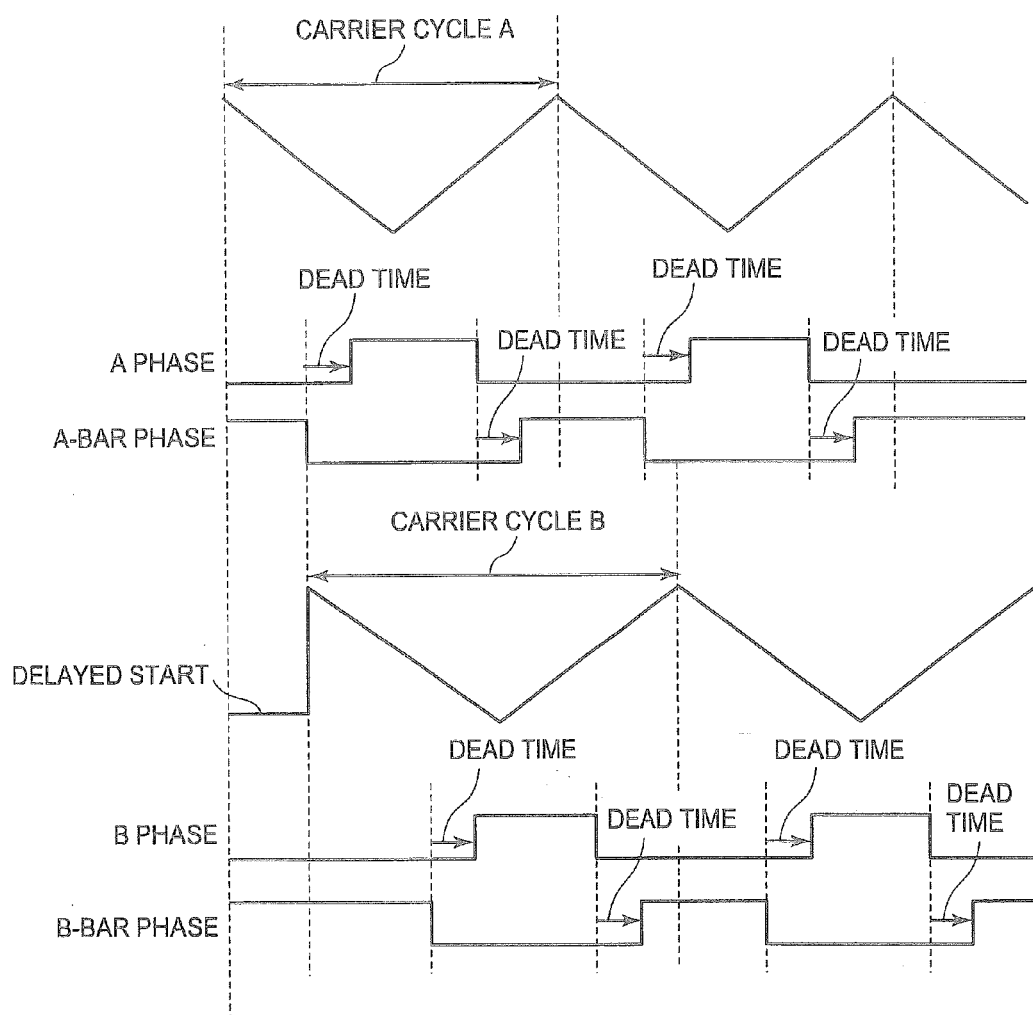
FIG. 11 is a waveform diagram according to operation example 3 of a timer unit circuit.

As a result, the output signals TOUT2, TOUT3, TOUT6 and TOUT7 exhibit the full-bridge control waveforms shown in FIG. 11. The full-bridge control waveforms include an A-phase PWM waveform, an A-bar phase PWM waveform, a B-phase PWM waveform and a B-bar phase PWM waveform. The phases of the B-phase PWM waveform and the B-bar phase PWM waveform are delayed by the delay time from those of the A-phase PWM waveform and the A-bar phase PWM waveform.

The power supply circuit 2 supplies power to the heating coil for induction heating based on the output signals TOUT2, TOUT3, TOUT6 and TOUT7. In this case, the carrier cycle A of the A-phase PWM waveform and the A-bar phase PWM waveform is different from the carrier cycle B of the B-phase PWM waveform and the B-bar phase PWM waveform.

Operation Example 4

Operation example 4 of the timer unit circuit 3 for providing a versatile function will be described below. Examples of the versatile function can include an interval function, an event counting function, a one-counting function and a basic PWM pulse outputting function.

In operation example 4, the counter circuit 20 is set to an interval function, the counter circuit 21 is set to an event counting function, the counter circuit 22 is set to a one-counting function, the counter circuit 23 is set to an interval function, the counter circuits 24 to 26 are set to a basic PWM output function, and the counter circuit 27 is set to a one-counting function. For the basic PWM output function, carrier cycle setting and duty setting are required. The carrier cycle setting is assigned to the counter circuit 24, and the duty setting is assigned to the counter circuit 25 and the counter circuit 26.

Figure 12A:
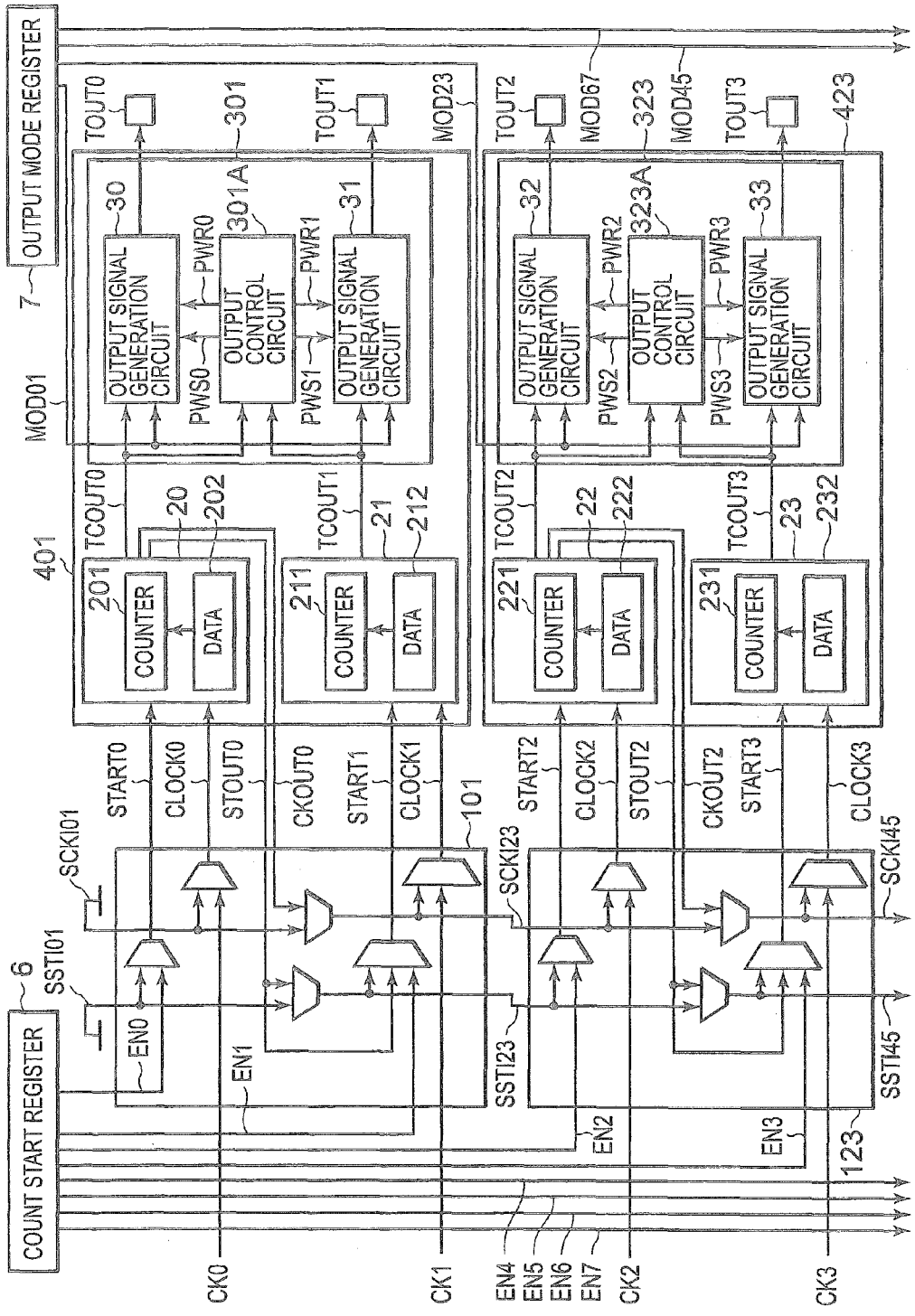
FIGS. 12A and 12B are block diagrams illustrating operation example 4 of a timer unit circuit.

Hereinafter, the operation of the timer unit circuit 3 for providing an interval function will be described using FIG. 12A and FIG. 13.

In an interval function, a particular interval is periodically generated using the externally-input signal CK0, the intervals are kept constant, and an interrupt signal, or the output signal TOUT0 exhibiting a toggle waveform is output.

The selection circuit 101 selects the count enable signal EN0 as the trigger signal START0, and selects the signal CK0 as the clock signal CLOCK0.

Figure 13:
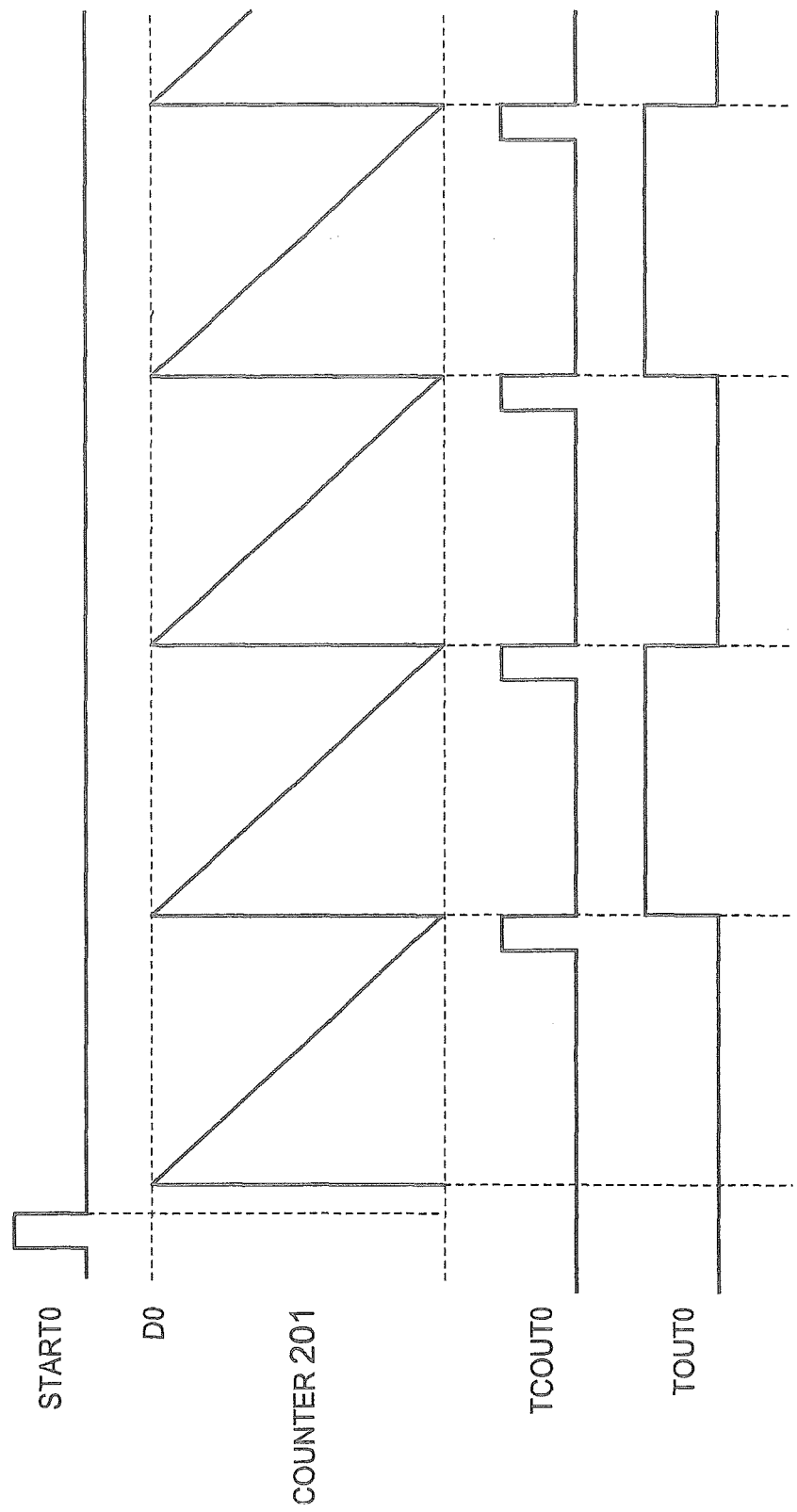
FIG. 13 is a waveform diagram relating to an interval function.

Referring to FIG. 13, after detection of an input of the trigger signal START0, the counter 201 loads the count start value D0 in synchronization with the first shot of the clock signal CLOCK0. Subsequently, the counter 201 executes a down-counting operation from the count start value D0 in synchronization with the clock signal CLOCK0. The count start value D0 comes corresponding to an interval cycle. After a lapse of an interval cycle, the counter circuit 20 outputs a one-shot pulse as the counter circuit output signal TCOUT0. The counter circuit output signal TCOUT0 is used as an interrupt signal for the CPU4 or the external device 9. Also, the output mode register 7 outputs the output mode selection signal MOD01, which exhibits a single-phase waveform output mode. Accordingly, the output signal generation circuit 30 outputs pulses that are set to an ON level by the odd-number-th pulses of the counter circuit output signal TCOUT0, and are reset to an OFF level by the even-number-th pulses as the output signal TOUT0.

The counter circuit 23 and the output signal generation circuit 33 operate as the counter circuit 20 and the output signal generation circuit 30 do.

Hereinafter, the operation of the timer unit circuit 3 for proving an event counting function will be described using FIG. 12A and FIG. 14.

In an event counting function, the externally-input signal CK1 is counted a predetermined number of times, and an interrupt signal, or the output signal TOUT1, which exhibits a toggle waveform, is output as a result of the end of the counting.

The selection circuit 101 selects the count enable signal EN1 as the trigger signal START1, and selects the signal CK1 as the clock signal CLOCK1.

Figure 14:
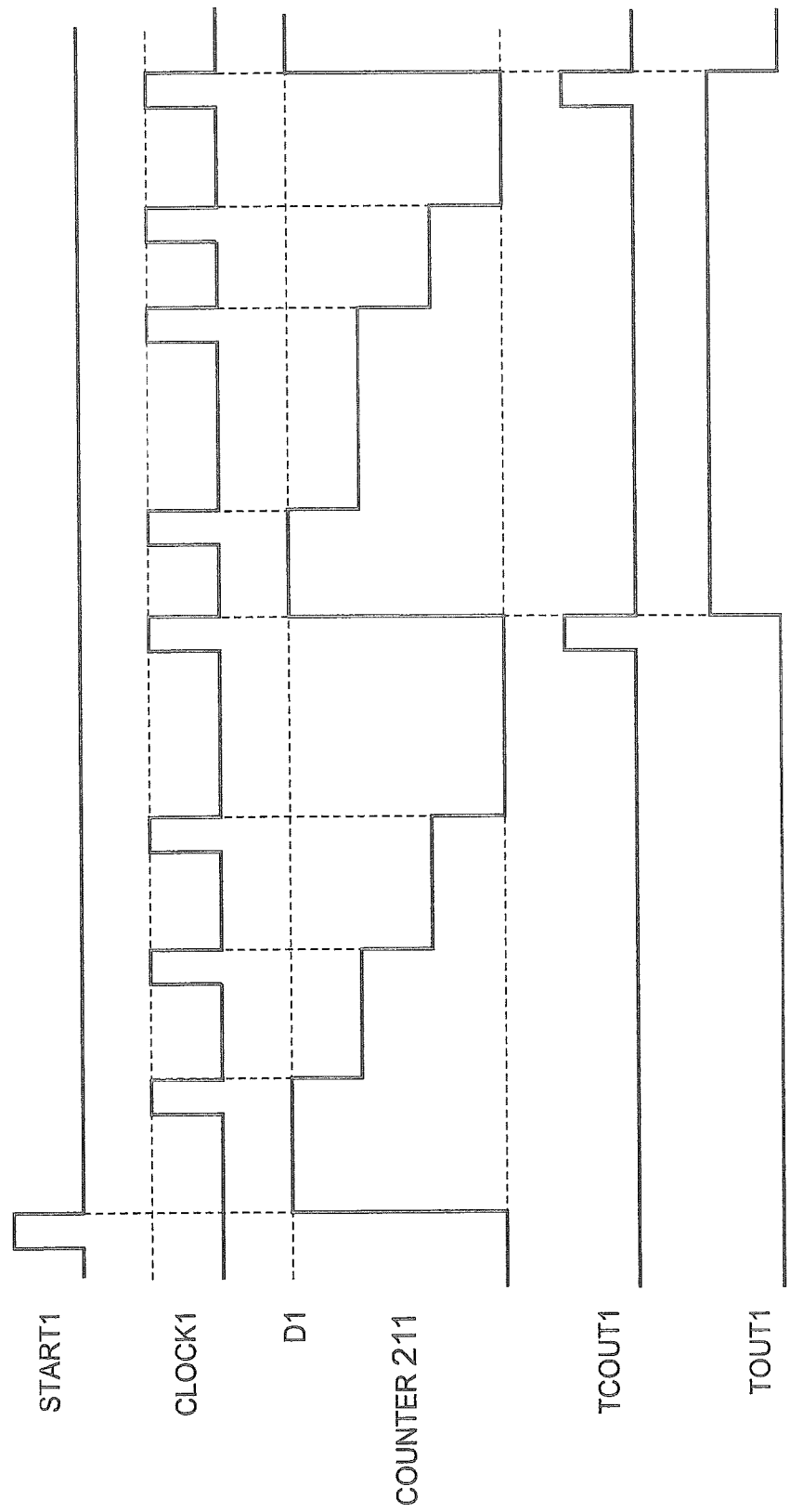
FIG. 14 is a waveform diagram relating to an event counting function.

Referring to FIG. 14, the counter 211 loads the count start value D1 in response to an input of the trigger signal START1. Subsequently, the counter 211 executes a down-counting operation from the count start value D1 in synchronization with the clock signal CLOCK1. The count start value D1 comes corresponding to the aforementioned predetermined number of times. After the counter 211 counted the predetermined number of times, the counter circuit 21 outputs a one-shot pulse as the counter circuit output signal TCOUT1. The counter circuit output signal TCOUT1 is used as an interrupt signal for the CPU4 or the external device 9. Also, the output mode register 7 outputs the output mode selection signal MOD01, which exhibits a single-phase waveform output mode. Accordingly, the output signal generation circuit 31 outputs pulses that are set to an ON level by the odd-number-th pulse of the counter circuit output signal TCOUT1 and are reset to an OFF level by the even-number-th pulses, as the output signal TOUT1.

Hereinafter, the operation of the timer unit circuit 3 for providing a one-counting function will be described using FIG. 12A and FIG. 15.

In a one-counting function, counting a predetermined number of times is executed only once based on an externally-input trigger, and an interrupt signal, or the output signal TOUT2 exhibiting a toggle waveform is output.

The selection circuit 123 selects the count enable signal EN2 as the trigger signal START2, and selects the signal CK2 as the clock signal CLOCK2.

Figure 15:
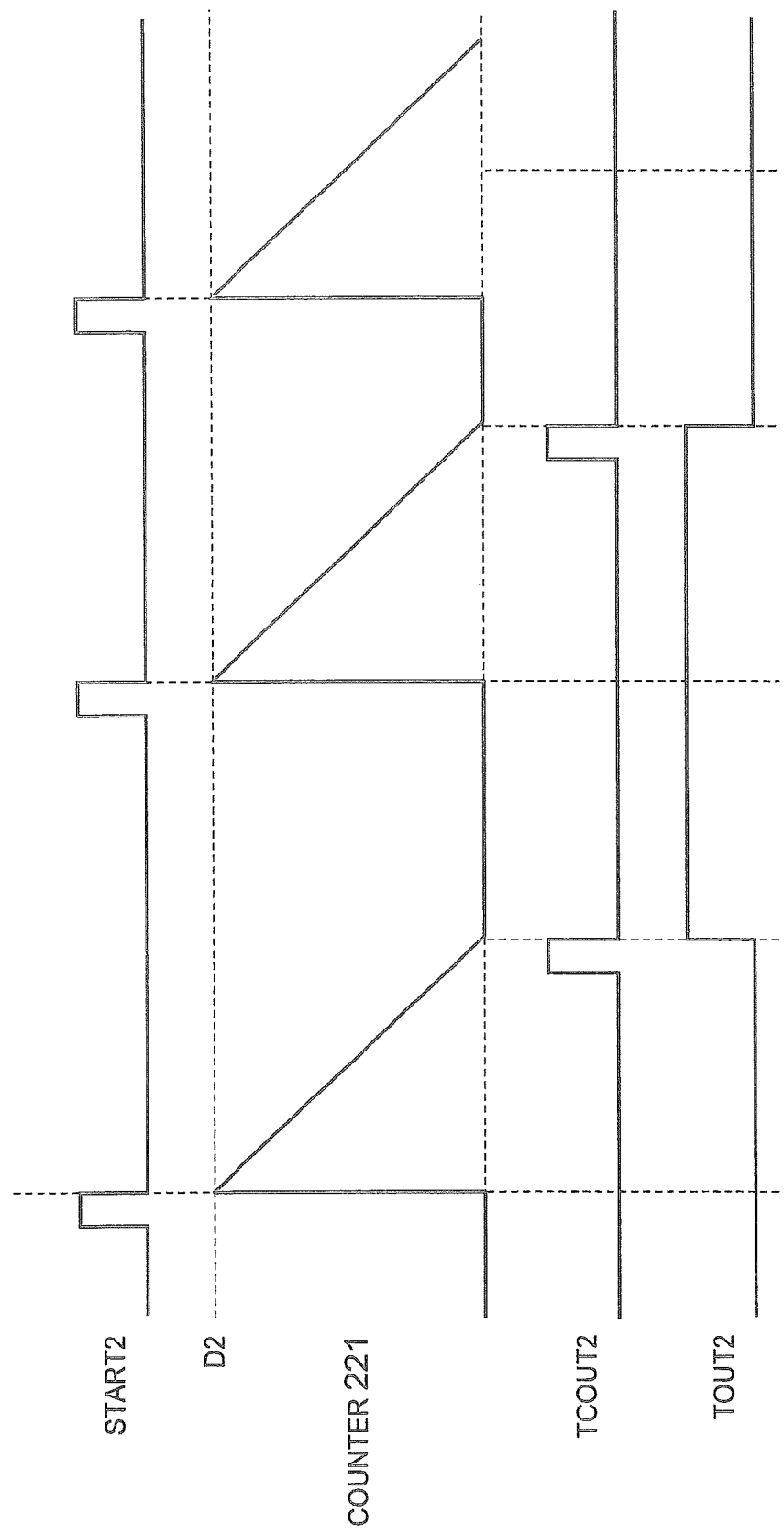
FIG. 15 is a waveform diagram relating to a one-counting function.

Referring to FIG. 15, after detection of an input of the trigger signal START2, the counter 221 executes a down-counting operation from the count start value D2 in synchronization with the clock signal CLOCK2. The count start value D2 comes corresponding to the aforementioned predetermined number of times. After the counter 221 counted the predetermined number of times, the counter 221 stops the down-counting operation, and the counter circuit 22 outputs a one-shot pulse as the counter circuit output signal TCOUT2. The counter circuit output signal TCOUT2 is used as an interrupt signal for the CPU4 or the external device 9. Also, the output mode register 7 outputs the output mode selection signal MOD23, which exhibits a single-phase waveform output mode. Accordingly, the output signal generation circuit 32 outputs pulses that are set to an ON level by the odd-number-th pulses of the counter circuit output signal TCOUT2, and are reset to an OFF level by the even-number-th pulses, as the output signal TOUT2.

The counter circuit 27 and the output signal generation circuit 37 also operate as the counter circuit 22 and the output signal generation circuit 32 do.

Figure 12B:
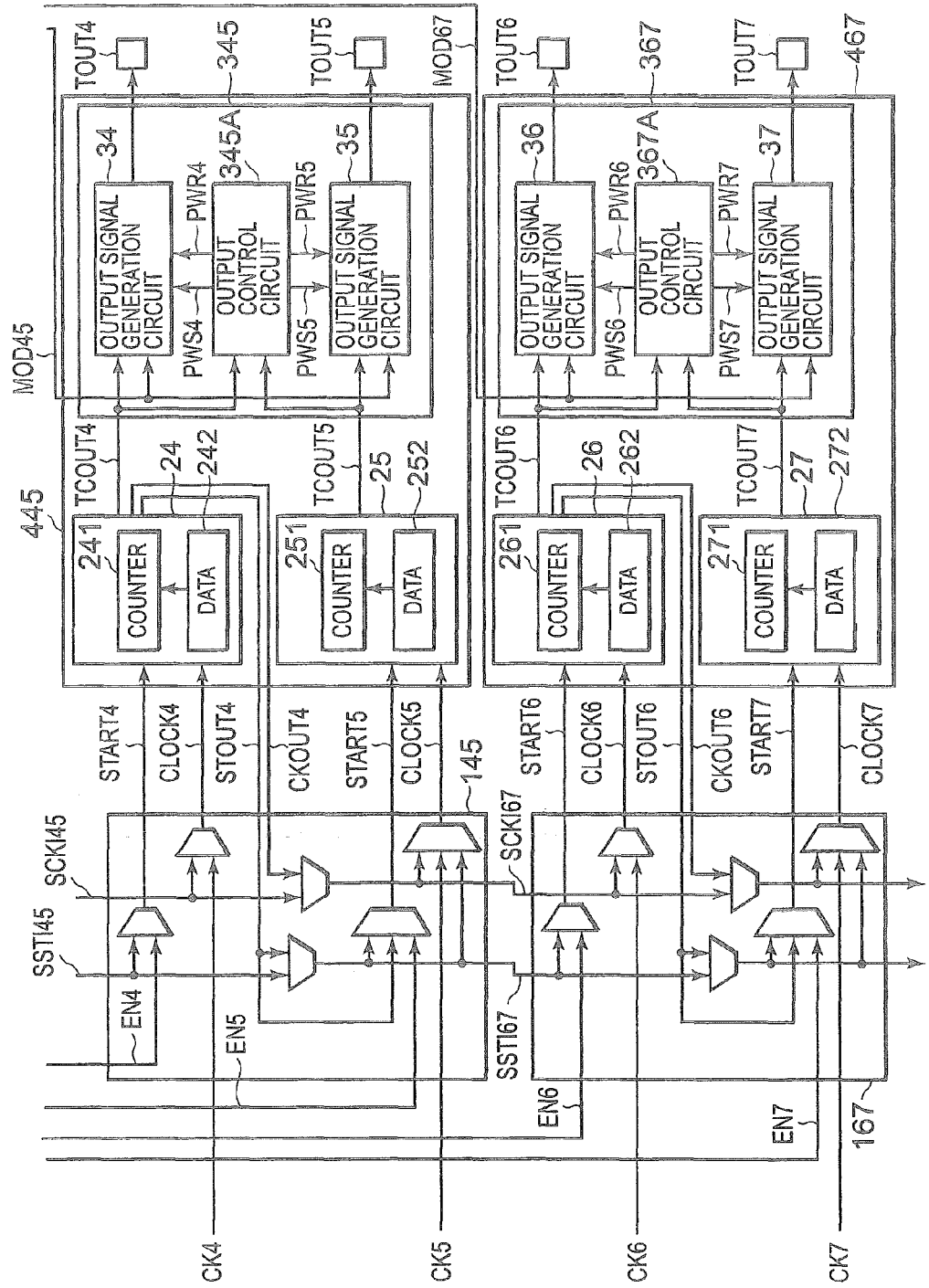

Hereinafter, the operation of the timer unit circuit 3 for providing a basic PWM pulse outputting function will be described using FIG. 12B and FIG. 16.

The selection circuit 145 selects the count enable signal EN4 as the trigger signal START4, and selects the signal CK4 as the clock signal CLOCK4.

Figure 16:
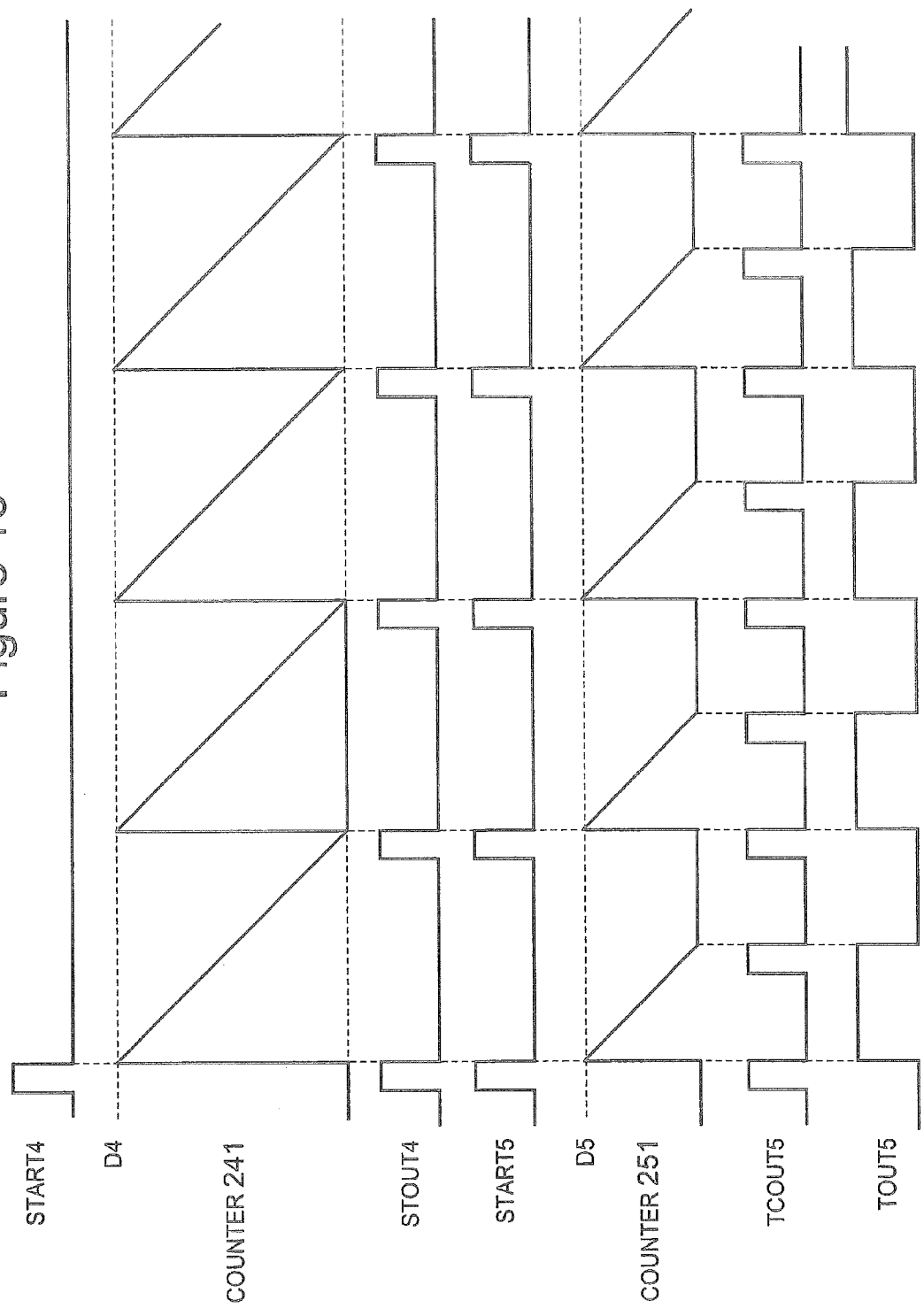
FIG. 16 is a waveform diagram relating to a basic PWM pulse outputting function.

Referring to FIG. 16, the counter circuit 24 is used for carrier cycle setting. After detection of an input of the trigger signal START4, the counter 241 executes a down-counting operation from the count start value D4 in synchronization with the clock signal CLOCK4. The count start value D4 comes corresponding to a carrier cycle. After a lapse of time corresponding to the count start value D4, the counter circuit 24 outputs a one-shot pulse as the count cycle signal STOUT4. The count cycle signal STOUT4 is transmitted via the selection circuit 145 to the counter circuit 25 as the trigger signal START5, and is transmitted via the selection circuit 145 and the selection circuit 167 to the counter circuit 26 as the trigger signal START6. Accordingly, the counter circuits 24, 25 and 26 simultaneously start counting. The counter circuit 24 outputs the clock signal CLOCK4 as the count clock signal CKOUT4. The count clock signal CKOUT4 is transmitted via the selection circuit 145 to the counter circuit 25 as the clock signal CLOCK5, and is transmitted via the selection circuits 145 and 167 to the counter circuit 26 as the clock signal CLOCK6. Accordingly, the clock signals are unified among the counter circuits 24, 25 and 26.

The counter circuit 25 is used for duty setting. After detection of an input of the trigger signal START5, the counter 251 outputs a one-shot pulse as the counter circuit output signal TCOUT5. Also, the counter 251 executes a down-counting operation from the count start value D5 in synchronization with the clock signal CLOCK5. Here, the count start value D5 comes corresponding to a duty width period. After a lapse of the duty width period, also, the counter circuit 25 outputs a one-shot pulse as TCOUT5. The output mode register 7 outputs the output mode selection signal MOD45, which exhibits a single-phase waveform output mode. Accordingly, the output signal generation circuit 35 outputs pulses that are set to an ON level by the odd-number-th pulses of the counter circuit output signal TCOUT5 and are reset to an OFF level by the even-number-th pulses, as the output signal TOUT5.

The counter circuit 26 and the output signal generation circuit 36 also operate as the counter circuit 25 and the output signal generation circuit 35 do.

As described above, by means of making the settings of the counter circuits 20 to 27 and the output mode register 7, the timer unit circuit 3 can provide various versatile functions.

In each of operation examples 1 to 4 described above, the count start register 6 may simultaneously outputs a plurality of count enable signals selected from the count enable signals EN0 to EN7. In this case, a plurality of counter circuits for the plurality of count enable signals simultaneously start counting. All of the count enable signals EN0 to EN7 may be selected.

According to the first exemplary embodiment, the role of a counter circuit is changed as a result of selection of a trigger signal and a clock signal. Also, the output mode of an output circuit can be selected. Accordingly, the timer unit circuit 3 can execute various operations as in operation examples 1 to 4. Accordingly, the timer unit circuit 3 and the microcontroller 1 including the timer unit circuit 3 have high versatility.

Second Exemplary Embodiment

A timer unit circuit 3 according to a second exemplary embodiment is different from the timer unit circuit 3 according to the first exemplary embodiment in terms of the configurations of the selection circuits 101, 123, 145 and 167 so that a signal thinning-out function can be provided.

Figure 17:
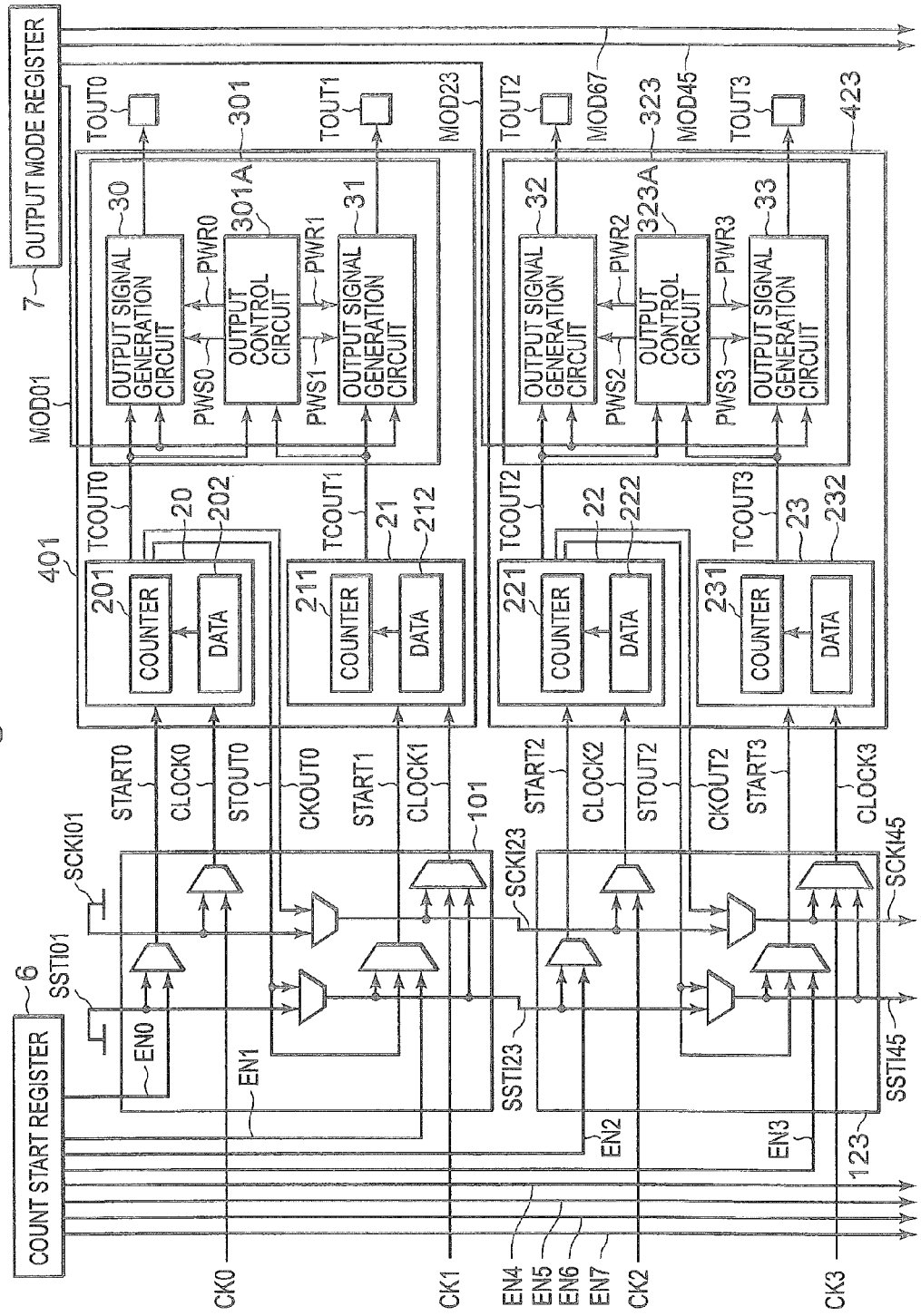
FIG. 17 is a block diagram of a timer unit circuit according to a second exemplary embodiment of the present invention.

Referring to FIG. 17, a selection circuit 101 according to the second exemplary embodiment selects one from a count clock transmission signal SCKI23, a signal CK1 and a count cycle transmission signal SSTI23 as a clock signal CLOCK1 and outputs it to a counter circuit 21. On the other points, the configuration of the selection circuit 101 according to the second exemplary embodiment is the same as the configuration of the selection circuit 101 according to the first exemplary embodiment. A selection circuit 123 according to the second exemplary embodiment selects one from a count clock transmission signal SCKI45, a signal CK3 and a count cycle transmission signal SSTI45 as a clock signal CLOCK3 and outputs it to a counter circuit 23. On the other points, the configuration of the selection circuit 123 according to the second exemplary embodiment is the same as the configuration of the selection circuit 123 according to the first exemplary embodiment.

Similarly, a selection circuit 145 according to the second exemplary embodiment selects one from a count clock transmission signal SCKI67, a signal CK5 and a count cycle transmission signal SSTI67 as a clock signal CLOCK5 and outputs it to a counter circuit 25. On the other points, the configuration of the selection circuit 145 according to the second exemplary embodiment is the same as the configuration of the selection circuit 145 according to the first exemplary embodiment. A selection circuit 167 according to the second exemplary embodiment selects one from a count clock transmission signal SCKI67, a signal CK7, the count cycle transmission signal SSTI67 and a count cycle transmission signal SSTI67 as a clock signal CLOCK7 and outputs it to a counter circuit 27. On the other points, the configuration of the selection circuit 167 according to the second exemplary embodiment is the same as the configuration of the selection circuit 167 according to the first exemplary embodiment.

Operation Example 5

Operation example 5 of the timer unit circuit 3 for providing a signal thinning-out function will be described below. Operation example 5 has been provided as a result of partially changing operation example 2.

The operation of the selection circuit 101 and a channel 401 according to operation example 5 will be described using FIG. 17 and FIG. 18.

The counter circuit 20 is used for setting a carrier cycle A. The selection circuit 101 selects a count enable signal EN0 as a trigger signal START0, and selects a signal CK0 as a clock signal CLOCK0.

After detection of an input of the trigger signal START0, the counter 201 executes a down-counting operation from a count start value D0 in synchronization with the clock signal CLOCK0. The count start value D0 comes corresponding to the carrier cycle A. After a lapse of time corresponding to the count start value D0, the counter circuit 20 outputs a one-shot pulse as a count cycle signal STOUT0.

The count cycle signal STOUT0 is transmitted via the selection circuit 101 to the counter circuit 21 as the clock signal CLOCK1.

The counter circuit 21 executes a signal thinning-out function based on the count cycle signal STOUT0.

The selection circuit 101 selects the count cycle signal STOUT0 as the clock signal CLOCK1, and selects a count enable signal EN1 as a trigger signal START1.

After detection of an input of the trigger signal START1, a counter 211 loads a count start value D1, and subsequently executes a down-counting operation from the count start value D1 in synchronization with the clock signal CLOCK1. The count start value D1 comes corresponding to a predetermined number of signal-thinning-outs. In FIG. 18, the count start value D1 is 7. After the counter 211 counts the number of signal-thinning-outs, the counter circuit 21 outputs a one-shot pulse as a counter circuit output signal TCOUT1. The counter circuit output signal TCOUT1 is used as an interrupt signal for the CPU4 or the external device 9.

Figure 18:
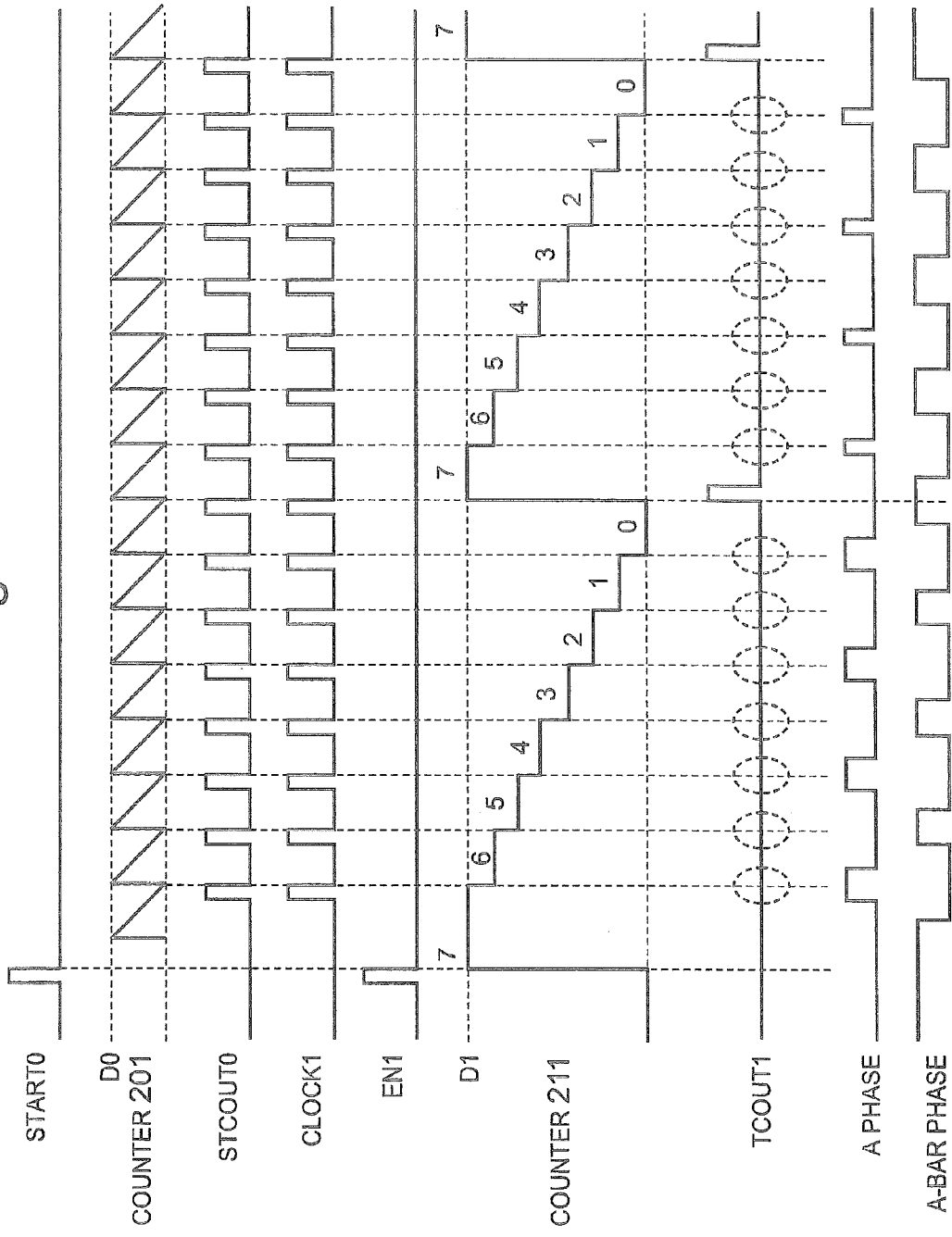
FIG. 18 is a waveform diagram relating to a signal thinning-out function.

Counter circuit output signals TCOUT2 and TCOUT3 exhibit the A-phase PWM waveform and the A-bar phase PWM waveform shown in FIG. 18.

In response to the counter circuit output signal TCOUT1 as an interrupt signal, the CPU4 or the external device 9 calculates a value corresponding to each of count start values D2, D3, D6 and D7, and update the respective count start values D2, D3, D6 and D7 to the calculated values. Accordingly, the A-phase PWM waveform and the A-bar phase PWM waveform have different waveforms between the sections before and after the pulse of the counter circuit output signal TCOUT1.

Operation example 5 is similar to operation example 2 in terms of the points other than the aforementioned points.

In operation example 5, compared to the case where the count cycle signal STOUT0 whose pulse interval corresponds to the carrier cycle is used as an interrupt signal for the CPU4 or the external device 9, a longer time for calculating the values is secured. Accordingly, operation example 5 is favorable for the case where the carrier cycle is short, the case where the processing speed of the CPU4 or the external device 9 is low, and the case where calculation of the values is complicated. The signal thinning-out function can also be applied to operation example 1, 3 or 4.

Further, it is noted that Applicant's intent is to encompass equivalents of all claim elements, even if amended later during prosecution.

What is claimed is:

1. A timer unit having a first output mode and a second output mode, the timer unit comprising:
   a first register that stores a first value;
   a second register that stores a second value;
   a third register that stores a third value;
   a first counter that generates a first count signal based on the first value;
   a second counter that generates a second count signal based on the second value;
   a third counter that generates a third count signal based on the third value; and
   an output circuit that outputs a first output signal and a second output signal,
   wherein, when the timer unit is set in the first output mode, the output circuit outputs the first output signal having a pulse width determined by the first count signal and the second count signal, and outputs the second output signal having a pulse width determined by the first count signal and the third count signal, and
   wherein, when the timer unit is set in the second output mode, the output circuit outputs the first output signal having a pulse width determined by the first count signal, the second count signal, and the third count signal.

2. The timer unit according to claim 1, wherein the first and second output signals include pulse width modulation (PWM) signals.

3. The timer unit according to claim 2, wherein, when the timer unit is set in the second output mode, the second output signal includes a reversed phase signal of the first output signal.

4. The timer unit according to claim 1, further comprising an output mode register to set the timer unit in the first output mode or the second output mode.

5. The timer unit according to claim 1, wherein the output circuit inserts a dead time in the first output signal when the timer unit is set in the second output mode.

6. The timer unit according to claim 1, wherein, when the timer unit is set in the first mode, a duty of the first output signal is determined by the second count signal.

7. The timer unit according to claim 1, wherein, when the timer unit is set in the second mode, a duty of the first output signal is determined by the second count signal and a dead time of the first output signal is determined by the third count signal.

8. A microcontroller, comprising:
   first and second timer units, each of the timer units comprising the timer unit according to claim 1; and
   a central processing unit (CPU).

* * * * *